(12) United States Patent
Kang et al.

(10) Patent No.: US 12,733,546 B2
(45) Date of Patent: Sep. 8, 2026

(54) SEMICONDUCTOR PACKAGE AND METHOD OF MANUFACTURING THE SAME

(71) Applicant: Samsung Electronics Co., Ltd., Suwon-si (KR)

(72) Inventors: Raeyoung Kang, Suwon-si (KR); Minki Kim, Suwon-si (KR); Hyuekjae Lee, Suwon-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 394 days.

(21) Appl. No.: 18/212,461

(22) Filed: Jun. 21, 2023

(65) Prior Publication Data

US 2024/0071995 A1 Feb. 29, 2024

(30) Foreign Application Priority Data

Aug. 31, 2022 (KR) ........................ 10-2022-0109983

(51) Int. Cl.
*H10W 90/00* (2026.01)
*H10W 20/42* (2026.01)
(Continued)

(52) U.S. Cl.
CPC ........... *H10W 90/00* (2026.01); *H10W 20/42* (2026.01); *H10W 70/611* (2026.01);
(Continued)

(58) Field of Classification Search
CPC ............... H10W 20/42; H10W 20/435; H10W 20/2134; H10W 20/0698; H10W 20/0249; H10W 20/0245; H10W 20/023; H10W 70/611; H10W 70/635; H10W 70/60; H10W 70/65; H10W 72/853; H10W 72/923; H10W 72/926; H10W 72/936; H10W 72/9415; H10W 72/952;
(Continued)

(56) References Cited

U.S. PATENT DOCUMENTS 5,858,815 A 1/1999 Heo et al.
8,810,040 B2 8/2014 Kaneko et al.
(Continued)

FOREIGN PATENT DOCUMENTS

CN 102169845 A 8/2011
JP 2013247139 A 12/2013
(Continued)

*Primary Examiner* — Dao H Nguyen
(74) *Attorney, Agent, or Firm* — Muir Patent Law, PLLC

(57) ABSTRACT

A semiconductor package includes a first semiconductor chip including a first semiconductor layer, a first through-electrode passing through the first semiconductor layer in a vertical direction, and a first bonding pad connected to the first through-electrode, and a second semiconductor chip including a second semiconductor layer on the first semiconductor chip, a wiring structure between the second semiconductor layer and the first semiconductor chip, a wiring pad connected to the wiring structure below the wiring structure, and a second bonding pad connected to the wiring pad below the wiring pad and in contact with the first bonding pad, wherein the second bonding pad includes a protrusion protruding toward the wiring pad.

20 Claims, 26 Drawing Sheets

(51) Int. Cl.

| | |
|---|---|
| ***H10W 70/60*** | (2026.01) |
| ***H10W 70/63*** | (2026.01) |
| ***H10W 72/00*** | (2026.01) |
| ***H10W 72/90*** | (2026.01) |
| ***H10W 80/00*** | (2026.01) |
| ***H10W 90/22*** | (2026.01) |

(52) U.S. Cl.
CPC .......... *H10W 70/635* (2026.01); *H10W 70/60* (2026.01); *H10W 72/853* (2026.01); *H10W 72/923* (2026.01); *H10W 72/926* (2026.01); *H10W 72/936* (2026.01); *H10W 72/9415* (2026.01); *H10W 72/952* (2026.01); *H10W 80/721* (2026.01); *H10W 80/732* (2026.01); *H10W 80/743* (2026.01); *H10W 90/22* (2026.01); *H10W 90/724* (2026.01); *H10W 90/792* (2026.01)

(58) Field of Classification Search
CPC ... H10W 72/90; H10W 72/20; H10W 80/721; H10W 80/732; H10W 80/743; H10W 80/701; H10W 80/327; H10W 80/312; H10W 80/00; H10W 90/00; H10W 90/22; H10W 90/724; H10W 90/792; H10W 90/291; H10W 90/701; H10W 90/401; H10W 90/297
See application file for complete search history.

(56) References Cited

U.S. PATENT DOCUMENTS

| | | | | |
|---|---|---|---|---|
| 10,011,093 | B2 | 7/2018 | Terasaki et al. | |
| 10,483,183 | B2 | 11/2019 | Orimoto | |
| 10,510,592 | B2 * | 12/2019 | Kao | H10D 84/83 |
| 11,862,535 | B2 * | 1/2024 | Shih | H01L 21/3065 |
| 2013/0264720 | A1 * | 10/2013 | Chun | H01L 21/76898 257/774 |
| 2013/0313689 | A1 * | 11/2013 | Torii | H01L 23/481 257/621 |
| 2014/0374900 | A1 * | 12/2014 | Kwon | H01L 23/36 257/737 |
| 2015/0123278 | A1 * | 5/2015 | Park | H01L 24/03 257/774 |

FOREIGN PATENT DOCUMENTS

| | | | |
|---|---|---|---|
| JP | 2015005571 | A | 1/2015 |
| JP | 5830958 | B2 | 12/2015 |
| JP | 6156693 | B2 | 7/2017 |
| JP | 2018129352 | A | 8/2018 |
| JP | 6962095 | B2 | 11/2021 |
| KR | 10-1998-0006157 | A | 3/1998 |
| KR | 10-2015-0056534 | A | 5/2015 |
| KR | 1020220014364 | A | 2/2022 |
| KR | 1020220016365 | A | 2/2022 |

* cited by examiner

'A'

'A'

SEMICONDUCTOR PACKAGE AND METHOD OF MANUFACTURING THE SAME

CROSS-REFERENCE TO RELATED APPLICATION(S)

This application claims priority to Korean Patent Application No. 10-2022-0109983 filed on Aug. 31, 2022 in the Korean Intellectual Property Office, the disclosure of which is incorporated herein by reference in its entirety.

BACKGROUND

Aspects of the present inventive concept relate to a semiconductor package and a method of manufacturing the same.

According to the trend for miniaturization and high performance of semiconductor packages, development of a system-in-package (SiP) technology for embedding a plurality of semiconductor chips performing different functions in one package is being used. In order to form fine wirings connecting semiconductor chips within a package, a technology of forming through silicon vias (TSVs) and bonding semiconductor chips to each other through bonding pads has been used.

SUMMARY

An aspect of the present inventive concept is to provide a semiconductor package having improved reliability and a method of manufacturing the same.

According to an aspect of the present inventive concept, a semiconductor package includes: a first semiconductor chip including a first semiconductor layer, a first through-electrode passing through the first semiconductor layer in a vertical direction, and a first bonding pad connected to the first through-electrode; and a second semiconductor chip including a second semiconductor layer, the second semiconductor chip disposed on the first semiconductor chip, a wiring structure between the second semiconductor layer and the first semiconductor chip, a wiring pad connected to the wiring structure below the wiring structure, and a second bonding pad connected to the wiring pad and disposed below the wiring pad, the second bonding pad contacting the first bonding pad. The second bonding pad includes a top portion and a protrusion protruding from the top portion into the wiring pad.

According to another aspect of the present inventive concept, a semiconductor package includes: a first semiconductor chip; and a plurality of second semiconductor chips vertically stacked on the first semiconductor chip. Each of the plurality of second semiconductor chips includes: a semiconductor layer having a rear surface and a front surface opposing the rear surface; a rear bonding pad on the rear surface of the semiconductor layer; a through-electrode passing through the semiconductor layer and connected to the rear bonding pad; transistors on the front surface of the semiconductor layer; a front bonding pad on the front surface of the semiconductor layer; a wiring structure connecting the through-electrode to the transistors and formed between the front surface and the front bonding pad; and a wiring pad between the wiring structure and the front bonding pad. The front bonding pad has a top surface and includes a protrusion extending from the top surface into the wiring pad.

According to another aspect of the present inventive concept, a semiconductor package includes: a first structure; and a second structure on the first structure, wherein the first structure includes: a first semiconductor layer having a first front surface and a first rear surface opposing each other; a first device layer on the first front surface of the first semiconductor layer and including a first wiring structure; a first through-electrode passing through the first semiconductor layer and connected to the first wiring structure of the first device layer; and a first bonding structure including a first bonding pad on the first rear surface of the first semiconductor layer and connected to the first through-electrode and a first bonding insulating layer on a side surface of the first bonding pad, and the second structure includes: a second semiconductor layer having a second front surface and a second rear surface opposing each other; a second device layer on the second front surface of the second semiconductor layer and including a second wiring structure; and a second bonding structure including a second bonding pad below the second device layer and bonded to contact the first bonding pad and a second bonding insulating layer bonded to contact the first bonding insulating layer, wherein the second bonding pad includes a central region and an outer region surrounding the central region, and a height of an upper end of the central region is lower than a height of an upper end of the outer region.

According to another aspect of the present inventive concept, a method of manufacturing a semiconductor package includes: forming a first structure including a first semiconductor layer, a first through-electrode passing through the first semiconductor layer in a vertical direction, a first bonding pad connected to the first through-electrode, and a first bonding insulating layer surrounding the first bonding pad; forming a second semiconductor layer, a wiring structure on the second semiconductor layer, a wiring pad on the wiring structure, and a second bonding insulating layer on the wiring pad; forming an opening passing through the second bonding insulating layer to expose the wiring pad; removing a portion of the wiring pad and forming a recess portion of the wiring pad; forming a second structure by forming a second bonding pad in the opening and the recess portion; and bonding the first structure and the second structure so that the first bonding pad and the second bonding pad contact each other and the first bonding insulating layer and the second bonding insulating layer contact each other.

BRIEF DESCRIPTION OF DRAWINGS

The above and other aspects, features, and advantages of the present inventive concept will be more clearly understood from the following detailed description, taken in conjunction with the accompanying drawings, in which.

DETAILED DESCRIPTION

Hereinafter, example embodiments of the present inventive concept will be described with reference to the accompanying drawings.

Figure 1:
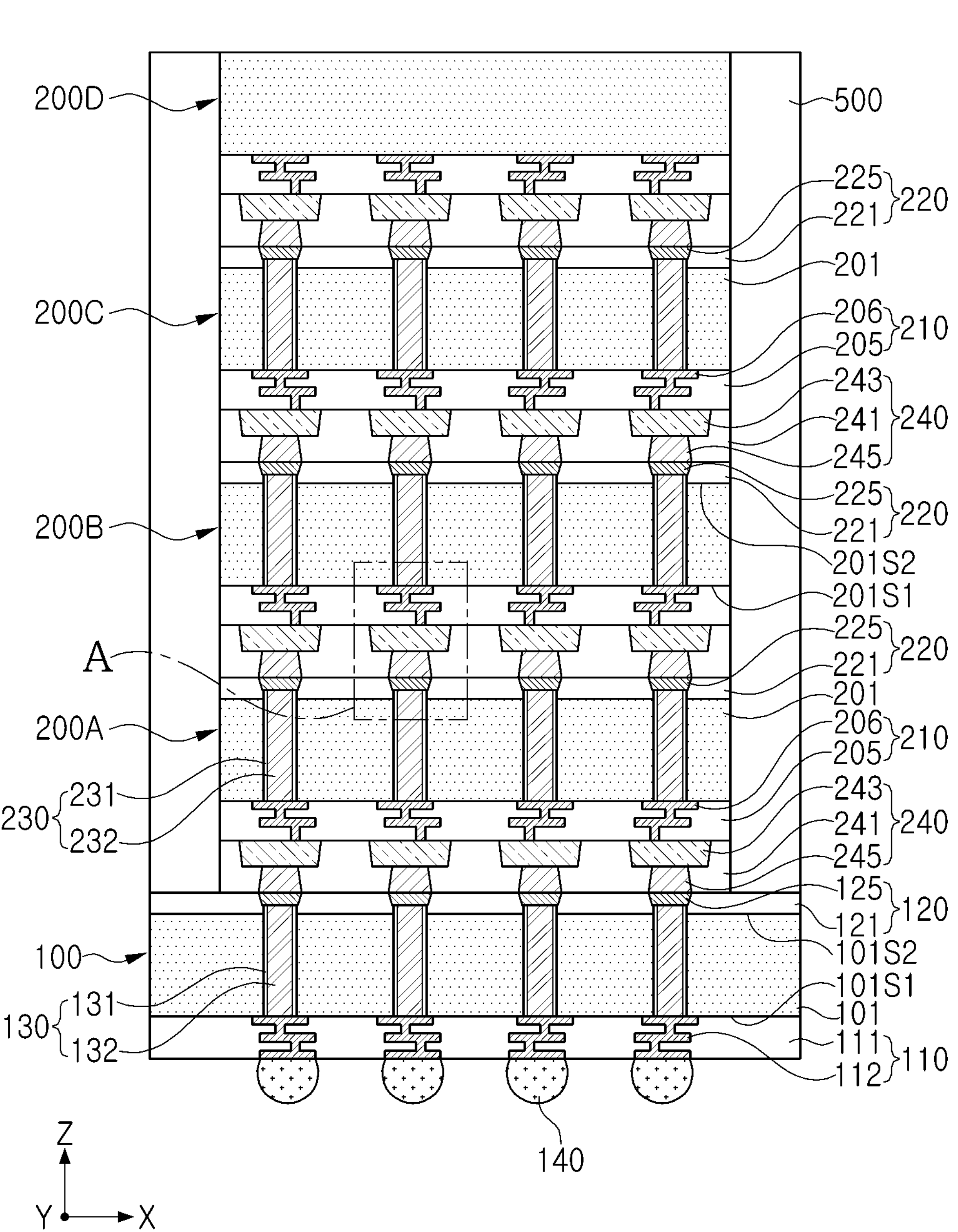
FIG. 1 is a cross-sectional view illustrating a semiconductor package according to example embodiments of the present inventive concept.

FIG. 1 is a cross-sectional view illustrating a semiconductor package according to an example embodiment of the present inventive concept.

Figure 2A:
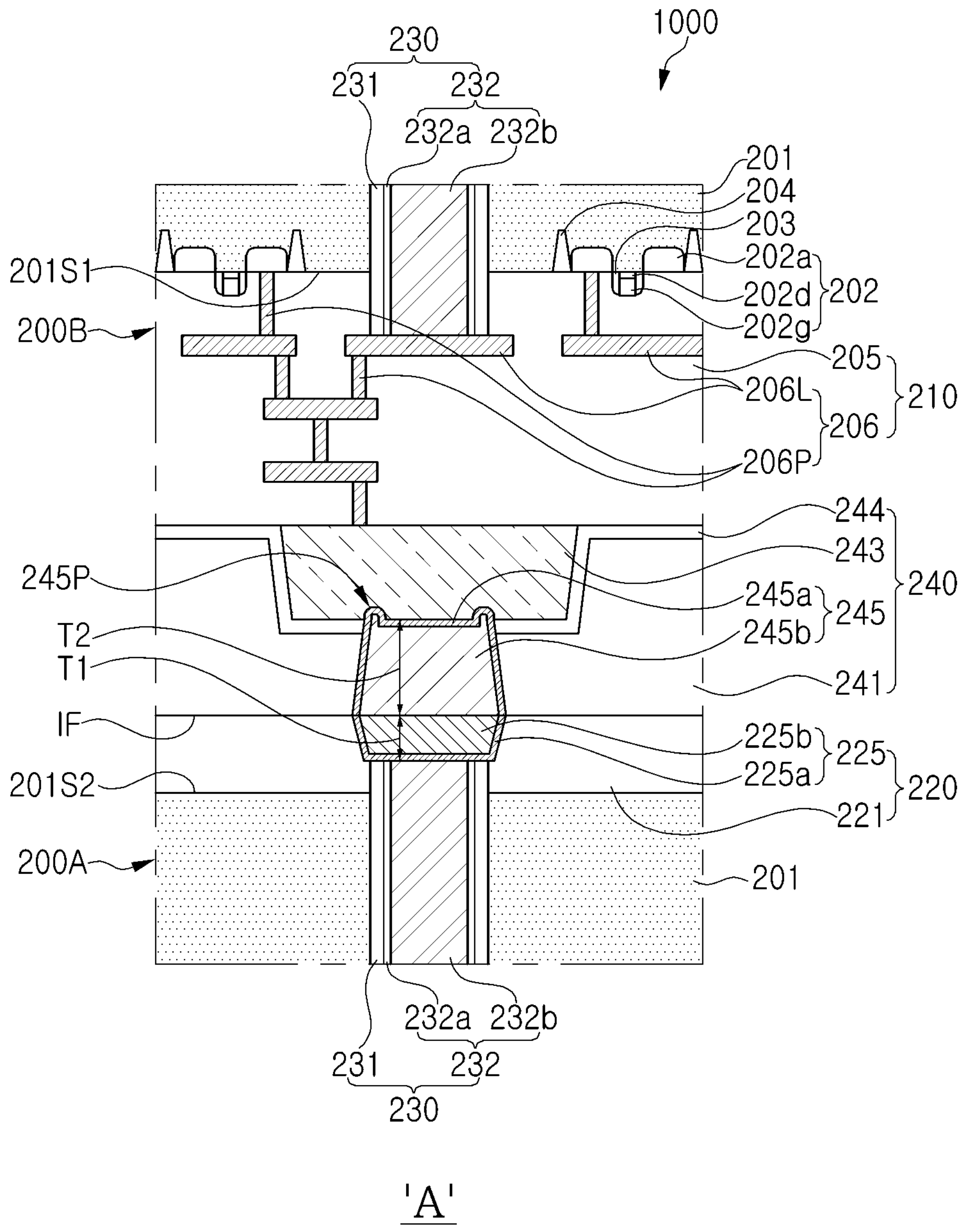
FIG. 2A is a partially enlarged view illustrating a semiconductor package according to example embodiments of the present inventive concept.
Figure 2B:
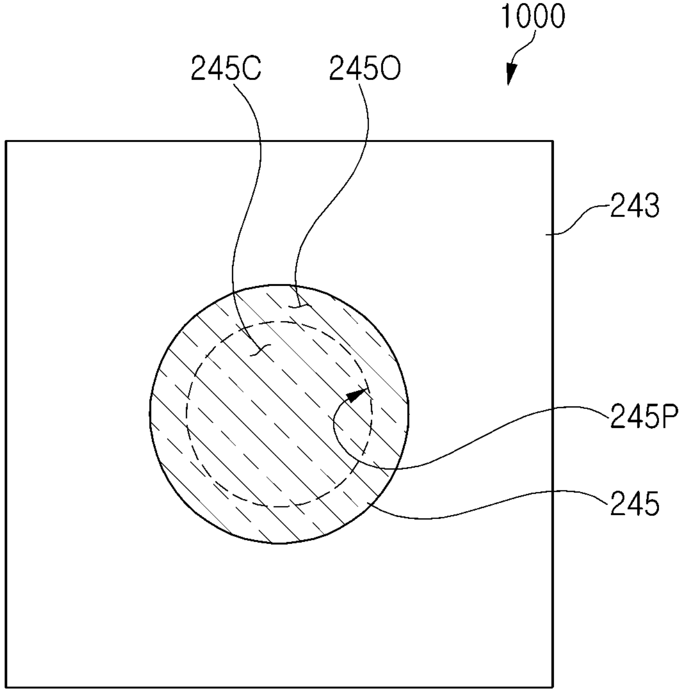
FIG. 2B is a plan view illustrating a semiconductor package according to example embodiments of the present inventive concept.

FIG. 2A is a partially enlarged view illustrating a semiconductor package according to example embodiments of the present inventive concept. FIG. 2A is an enlarged view of region 'A' in FIG. 1. FIG. 2B is a plan view illustrating a semiconductor package according to example embodiments of the present inventive concept. FIG. 2B is a diagram schematically illustrating only a wiring pad 243 and a front bonding pad 245, which are main components of a semiconductor package according to example embodiments.

Referring to FIGS. 1, 2A, and 2B, a semiconductor package 1000 according to an example embodiment may include a first semiconductor chip 100 and a plurality of second semiconductor chips 200A, 200B, 200C, and 200D. The plurality of second semiconductor chips 200A, 200B, 200C, and 200D may be stacked in a vertical direction (a Z-axis direction). According to embodiments, the plurality of second semiconductor chips 200A, 200B, 200C, and 200D may be provided in greater or smaller numbers than those illustrated in the drawing. For example, semiconductor packages according to the present inventive concept may include three or less or five or more second semiconductor chips.

The first semiconductor chip 100 and the plurality of second semiconductor chips 200A, 200B, 200C, and 200D stacked in the vertical direction (the Z-axis direction) may be electrically connected through first and second through-electrodes 132 and 232. The first semiconductor chip 100 and the plurality of second semiconductor chips 200A, 200B, 200C, and 200D may have a structure in which elements exposed from upper and lower surfaces of the respective semiconductor chips are directly bonded (which may be referred to as hybrid bonding or direct bonding, for example) without a separate connection member (e.g., a metal pillar, a solder bump, etc.). For example, dielectric-to-dielectric bonding and/or copper-to-copper bonding may be formed at an interface between the first semiconductor chip 100 and the lowermost second semiconductor chip 200A among the plurality of second semiconductor chips 200A, 200B, 200C, and 200D, and dielectric-to-dielectric bonding and/or copper-to-copper bonding may also be formed between adjacent semiconductor chips of the plurality of second semiconductor chips 200A, 200B, 200C, and 200D.

As illustrated in FIG. 2A, a rear bonding insulating layer 221 and a rear bonding pad 225 of the lower second semiconductor chip (e.g. 200A) may be bonded and coupled to a front bonding insulating layer 241 and a front bonding pad 245 of the upper second semiconductor chip (e.g. 200B). Spatially relative terms, such as "beneath," "below," "lower," "above," "upper," "top," "bottom," "front," "rear," and the like, may be used herein for ease of description to describe one element's or feature's relationship to another element(s) or feature(s) as illustrated in the figures. Unless the context clearly indicates otherwise, it will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly. Ordinal numbers such as "first," "second," "third," etc. may be used simply as labels of certain elements, steps, etc., to distinguish such elements, steps, etc. from one another. Terms that are not described using "first," "second," etc., in the specification, may still be referred to as "first" or "second" in a claim. In addition, a term that is referenced with a particular ordinal number (e.g., "first" in a particular claim) may be described elsewhere with a different ordinal number (e.g., "second" in the specification or another claim).

Hereinafter, components of the semiconductor package 1000 according to an example embodiment will be described in detail.

The first semiconductor chip 100 includes a first semiconductor layer 101 having a first front surface 101S1 and a first rear surface 101S2 opposing (e.g., opposite) each other, a first device layer 110 on the first front surface 101S1, a first rear surface structure 120 on the first rear surface 101S2, and a first through-structure 130. The first semiconductor chip 100 may be a buffer chip or a control chip including a plurality of logic devices and/or memory devices in the first device layer 110. The first semiconductor chip 100 may transmit signals from the plurality of second semiconductor chips 200A, 200B, 200C, and 200D stacked thereon to the outside (e.g., outside of the semiconductor package 1000), and also transmit signals and power from the outside to the plurality of second semiconductor chips 200A, 200B, 200C, and 200D.

The first semiconductor layer 101 may include or be formed of, for example, a semiconductor element, such as silicon (Si) or germanium (Ge), or a compound semiconductor, such as silicon carbide (SiC), gallium arsenide (GaAs), indium arsenide (InAs), or indium phosphide (InP). The first semiconductor layer 101 may have a silicon-on-insulator (SOI) structure. The first semiconductor layer 101 may include an active region, for example, a well doped with impurities or a structure doped with impurities. The first semiconductor layer 101 may include various device isolation structures, such as a shallow trench isolation (STI) structure. The first semiconductor layer 101 may have an active surface having an active region, and a non-active surface positioned opposite to the active surface. The first front surface 101S1 may be the active surface, and the first rear surface 101S2 may be the non-active surface.

The first device layer 110 may include first integrated circuits (ICs) of the first semiconductor layer 101. The first ICs may include a circuit for transmitting an address command or a control command, for example, an input/output (I/O) circuit, so that the plurality of second semiconductor chips 200A, 200B, 200C, and 200D may store or output data. For example, the ICs may perform both logic function and memory function through logic devices and memory devices, but may include only logic devices and perform only the logic function according to embodiments.

The first device layer 110 may include various types of individual devices. The individual devices may be disposed on the active region of the first front surface 101S1 of the first semiconductor layer 101 and may include various active devices and/or passive devices. The first device layer 110 may include a first wiring structure 112 connecting the first interlayer insulating layer 111 covering the individual devices and the individual devices to each other, connecting the individual devices to the active region of the first semiconductor layer 101, or connecting the individual devices to connection bumps 140. The first interlayer insulating layer 111 may include or be formed of silicon oxide, silicon nitride, silicon oxynitride, or tetraethylorthosilicate (TEOS). The first interlayer insulating layer 111 may include a plurality of layers. The first wiring structure 112 may include or be formed of a metal material including, for example, copper (Cu), aluminum (Al), silver (Ag), tin (Sn), gold (Au), nickel (Ni), lead (Pb), titanium (Ti), or alloys thereof. The first wiring structure 112 may have a multilayer structure including wiring patterns and vias. An insulating protective film (not illustrated) may be disposed between the first device layer 110 and the first semiconductor layer 101 to electrically separate the first wiring structure 112 from the first semiconductor layer 101.

The connection bumps 140 may be disposed below the first device layer 110. The connection bumps 140 may include bumps for communication with an external device (e.g., '800' in FIG. 11) in addition to bumps for communication with the plurality of second semiconductor chips 200A, 200B, 200C, and 200D. The connection bumps 140 may include or be formed of a low melting point metal, or an alloy including tin (Sn) (e.g., Sn—Ag—Cu). The connection bumps 140 may be, for example, solder balls. Each of the connection bumps 140 may have a land, ball, or pin shape. Each of the connection bumps 140 may be formed as a multilayer or a single layer.

The first rear surface structure 120 may be disposed on the first rear surface 101S2 of the first semiconductor layer 101, for example, on the non-active surface. The first rear surface structure 120 may include a first bonding pad 125 connected to the first through-electrode 132 and a first bonding insulating layer 121 on a side surface of the first bonding pad 125. The first bonding pad 125 and the first bonding insulating layer 121 may be directly bonded to the lowermost second semiconductor chip 200A among the plurality of second semiconductor chips 200A, 200B, 200C, and 200D. The first bonding insulating layer 121 may be formed of any one of silicon oxide, silicon nitride, silicon carbonation nitride, and silicon oxycarbonitride. The first bonding insulating layer 121 may have a multilayer structure. In this specification, the first rear surface structure 120 may be referred to as a "first bonding structure."

The first through-structure 130 may pass through the first semiconductor layer 101 in the vertical direction (the Z-axis direction) and provide an electrical path connecting the first wiring structure 112 and the first bonding pad 125 to each other. The first through-structure 130 may include a first spacer 131 and a first through-electrode 132. The first through-electrode 132 may include a conductive plug and a barrier layer surrounding the conductive plug, and this structure may be the same as or similar to the structure of the second through-electrode 232 of FIG. 2, described in greater detail below.

The plurality of second semiconductor chips 200A, 200B, 200C, and 200D may be disposed on the first semiconductor chip 100. Each of the plurality of second semiconductor chips 200A, 200B, 200C, and 200D includes a second semiconductor layer 201 having a second front surface 201S1 and a second rear surface 201S2 opposing each other, a second device layer 210 on the second front surface 201S 1, a second front structure 240 (e.g., second front surface structure) disposed below the second device layer 210, a second rear structure 220 (e.g., second rear surface structure) on the second rear surface 201S2 of the second semiconductor layer 201, and a second through-structure 230. Since the plurality of second semiconductor chips 200A, 200B, 200C, and 200D may have substantially the same or a similar structure, the second semiconductor chip 200A at the bottom will be mainly described, and reference numerals for the same components and redundant descriptions will be omitted. However, unlike the other second semiconductor chips 200A, 200B, and 200C, the uppermost second semiconductor chip 200D may not include the second through-structure 230. In addition, the second semiconductor layer 201, the second device layer 210, and the second through-structure 230 have characteristics that are the same as or similar to those of the first semiconductor layer 101, the first device layer 110, and the first through-structure 130 of the first semiconductor chip 100, redundant descriptions thereof will be omitted.

The second front surface 201S1 of the second semiconductor layer 201 may be an active surface having an active region, and the second rear surface 201S2 of the second semiconductor layer 201 may be a non-active surface located opposite to the active surface. The second semiconductor layer 201 may include a material that is the same as or similar to that of the first semiconductor layer 101. The second semiconductor layer 201 may have a smaller size than the first semiconductor layer 101 (e.g., area and/or thickness), but is not limited thereto.

The second device layer 210 may include transistors 202, device isolation layers 204, a second interlayer insulating layer 205, and a second wiring structure 206.

The second device layer 210 may include second ICs including the transistors 202 disposed on the second front surface 201S1 of the second semiconductor layer 201, for example, the active surface. The second ICs may include memory devices storing or outputting data based on address commands and control commands received from the first semiconductor chip 100. For example, the memory devices may include volatile memory devices, such as DRAM and SRAM, or non-volatile memory devices, such as PRAM, MRAM, FeRAM, and RRAM. In this case, semiconductor packages according to example embodiments may be used in high bandwidth memory (HBM) products or electro data processing (EDP) products.

Each of the transistors 202 may include a gate electrode 202*g*, a gate dielectric layer 202*d*, and an impurity region 202*a*, as illustrated in FIG. 2A. The impurity region 202*a* may be, for example, a well doped with impurities or a structure doped with impurities. The impurity region 202*a* may function as, for example, a source region or a drain region of the transistor 202. The gate dielectric layer 202*d* may be disposed between the gate electrode 202*g* and the active region of the second semiconductor layer 201. The active region may be limited by the device isolation layers 204 in the second semiconductor layer 201. The device isolation layers 204 may be formed by a shallow trench isolation (STI) process. Gate spacers 203 are disposed on both sides of the gate electrode 202*g*, and the gate spacers 203 may electrically insulate the gate electrode 202*g* from the impurity region 202*a*. The transistors 202 may be electrically connected to the second through-electrode 232 and the front bonding pad 245 through the second wiring structure 206. For example, the impurity region 202*a* may be connected to the second wiring structure 206 and electrically connected to the second through-electrode 232.

The second interlayer insulating layer 205 may cover the transistors 202 and the second wiring structure 206. The second interlayer insulating layer 205 may include or be formed of silicon oxide, silicon nitride, silicon oxynitride, or tetraethylorthosilicate (TEOS), for example.

The second front structure 240 may be disposed below the second device layer 210. The second front structure 240 may include a wiring pad 243 connected to the second wiring structure 206 below the second wiring structure 206, and a front bonding insulating layer 241 covering the wiring pad 243 and the front bonding pad 245. In this specification, the second front structure 240 may be referred to as "second bonding structure" or "front bonding structure."

The wiring pad 243 may be disposed between the front bonding pad 245 and a lowermost wiring pattern of wiring patterns 206L of the second wiring structure 206. The wiring pad 243 may be connected to a plug or via 206P of the second wiring structure 206 and may have a thickness greater than that of each wiring pattern 206L of the second wiring structure 206. The wiring pad 243 may be formed of copper (Cu), aluminum (Al), silver (Ag), tin (Sn), gold (Au), nickel (Ni), lead (Pb), titanium (Ti), or alloys thereof. The wiring pad 243 may include a metal material different from that of the second wiring structure 206 and the front bonding pad 245. For example, the wiring pad 243 may include aluminum (Al) or an aluminum (Al) alloy not included in the second wiring structure 206 or the front bonding pad 245.

In the semiconductor package 1000 according to an example embodiment, the second front structure 240 may further include a passivation layer 244 covering a side surface and a bottom surface of the wiring pad 243 below the second device layer 210. The passivation layer 244 may include or be formed of an insulating material, for example, one of silicon nitride (SiN), silicon carbide (SiC), silicon oxynitride (SiON), silicon carbonitride (SiCN), aluminum nitride (AlN), aluminum oxynitride (AlON), aluminum oxide (AlO), or aluminum oxide carbide (AlOC).

The front bonding pad 245 may be disposed on the second front surface 20151 of the second semiconductor layer 201. The front bonding pad 245 may be bonded to the rear bonding pad 225 below the front bonding pad 245 or the first bonding pad 125 to form part of the bonding interface IF. In this specification, the front bonding pad 245 may be referred to as a "second bonding pad." It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element (or using any form of the word "contact"), or as "bonded to" another element, there are no intervening elements present at the point of contact. Other words used to describe the relationship between elements should be interpreted in a like fashion (e.g., "between" versus "directly between," "adjacent" versus "directly adjacent," etc.).

The front bonding pad 245 may pass through the front bonding insulating layer 241 and the passivation layer 244 to contact the wiring pad 243. In an example embodiment, the front bonding pad 245 may have an inclined side surface as a width thereof decreases in a direction toward the wiring pad 243, but according to embodiments, the front bonding pad 245 may have substantially the same width and may have a vertical side surface perpendicular to the second rear surface 201S2 of the second semiconductor layer 201.

An upper surface of the front bonding pad 245 may contact a lower surface of the wiring pad 243. A width (or planar area, e.g., from a plan view) of the upper surface of the front bonding pad 245 may be smaller than a width (or planar area) of the lower surface of the wiring pad 243. The entire upper surface of the front bonding pad 245 may overlap the lower surface of the wiring pad 243. Referring to FIG. 2B, the front bonding pad 245 may have a circular or elliptical shape disposed within the wiring pad 243 in plan view.

In an example embodiment, the front bonding pad 245 may include a protrusion 245P protruding toward the wiring pad 243. The protrusion 245P may also be described as a ridge, or lip. The protrusion 245P may protrude or extend from a top portion, or top surface, of the front bonding pad 245. The protrusion 245P may extend into the wiring pad 243. For example, the wiring pad 243 may include a recess portion recessed by the protrusion 245P, and the wiring pad 243 may cover the protrusion 245P. In an example embodiment, the protrusion 245P may have a symmetrical shape with respect to a central axis of the front bonding pad 245 in the Z-direction. The front bonding pad 245 may have an upper surface including a first surface that is a surface of the protrusion 245P and a second surface extending from the first surface. Thus, the surface area of the upper surface of the front bonding pad 245 in contact with the wiring pad 243 may be greater than the planar area occupied by the same upper surface of the front bonding pad 245 when viewed from a plan view.

An average width, in a horizontal direction, of the front bonding pad 245, at a top surface of the front bonding pad 245, may be in a range from about 1 μm to about 20 μm, for example. Each of a width (in a horizontal direction) and thickness (in a vertical direction) of the protrusion 245P may range from about 0.1 μm to about 5 μm, for example. The width in the horizontal direction of the front bonding pad 245 at its top surface may be, for example, between 4 and 20 times the width in the horizontal direction of the protrusion 245P, and may be, for example, between 4 and 20 times the thickness in the vertical direction of the protrusion 245P. In some embodiments, the thickness in the vertical direction of the protrusion 245P may be between 0 to 2 times the width in the horizontal direction of the protrusion 245P.

Referring to FIG. 2B, the front bonding pad 245 may include a central region 245C and an outer region 245O surrounding the central region 245C. The protrusion 245P may be located in the outer region 245O. The protrusion 245P may be at least a portion of the outer region 245O located at a higher vertical level than that of the upper surface of the central region 245C. A height of an upper end of the central region 245C may be lower than a height of an upper end of the outer region 245O. In an example embodiment, the protrusion 245P may be located throughout the outer region 245O. In this case, the protrusion 245P may have an annular shape or a ring shape integrally extending along the outer region 245O. In an example embodiment, the protrusion 245P may extend along a side surface of the front bonding pad 245.

According to example embodiments of the present inventive concept, a contact area between the front bonding pad 245 and the wiring pad 243 may relatively increase due to the structure of the front bonding pad 245 having the protrusion 245P. Due to the increase in the contact area, adhesion between the front bonding pad 245 and the wiring pad 243 may be improved and/or heat transfer characteristics may be improved, so that a semiconductor package having improved reliability may be provided. In particular, when the front bonding pad 245 and the wiring pad 243 include different materials, defects due to interfacial peeling may be significantly improved. In addition, by forming the protrusion 245P to have a symmetrical shape from the central axis, defects due to the interface peeling in a specific direction may be prevented.

The front bonding pad 245 may include a barrier layer 245*a* and a conductive layer 245*b*. In an example embodiment, the barrier layer 245*a* may cover side and upper surfaces of the conductive layer 245*b*. In an example embodiment, the barrier layer 245*a* may be disposed to have a conformal thickness within the protrusion 245P. The barrier layer 245*a* may include or be formed of a metal compound, such as titanium nitride (TiN), tantalum nitride (TaN), or tungsten nitride (WN). The conductive layer 245*b* may include or be formed of a metal material, such as tungsten (W), titanium (Ti), aluminum (Al), or copper (Cu). The conductive layer 245*b* may be, for example, copper (Cu).

The front bonding insulating layer 241 may cover the wiring pad 243 and the passivation layer 244 below the second device layer 210 and may surround a side surface of the front bonding pad 245. The lower surface of the front bonding insulating layer 241 forms a bonding interface IF together with the lower surface of the front bonding pad 245 and may be substantially coplanar with the lower surface of the front bonding pad 245. The front bonding insulating layer 241 may be formed of different materials among silicon oxide, silicon nitride, silicon carbonitride, and silicon oxycarbonitride. In this specification, the front bonding insulating layer 241 may be referred to as a "second bonding insulating layer," though other terms may be used. Terms such as "same," "equal," "planar," or "coplanar," as used herein when referring to orientation, layout, location, shapes, sizes, compositions, amounts, or other measures do not necessarily mean an exactly identical orientation, layout, location, shape, size, composition, amount, or other measure, but are intended to encompass nearly identical orientation, layout, location, shapes, sizes, compositions, amounts, or other measures within acceptable variations that may occur, for example, due to manufacturing processes. The term "substantially" may be used herein to emphasize this meaning, unless the context or other statements indicate otherwise. For example, items described as "substantially the same," "substantially equal," or "substantially coplanar," may be exactly the same, equal, or coplanar, or may be the same, equal, or coplanar within acceptable variations that may occur, for example, due to manufacturing processes.

The second rear structure 220 may include a rear bonding pad 225 on the second rear surface 201S2 of the second semiconductor layer 201 and a rear bonding insulating layer 221 covering the second rear surface 201S2 of the second semiconductor layer 201 and covering the rear bonding pad 225. In this specification, the second rear structure 220 may be referred to as a "first bonding structure" or a "rear bonding structure," though other terms may be used.

The rear bonding pad 225 may contact the second through-electrode 232 of the second semiconductor layer 201. The rear bonding pad 225 may be bonded to the front bonding pad 245 on the rear bonding pad 225 to form part of the bonding interface IF. In this specification, the rear bonding pad 225 may be referred to as a "first bonding pad," though other terms may be used. The rear bonding pad 225 may have an inclined side surface with a width increasing toward the bonding interface IF, but may have substantially the same width and have a vertical side surface perpendicular to the bonding interface IF, according to embodiments.

The rear bonding pad 225 may include a barrier layer 225*a* and a conductive layer 225*b*. In an example embodiment, the barrier layer 225*a* may cover side and lower surfaces of the conductive layer 225*b*. The barrier layer 225*a* may include or be formed of a metal compound, such as titanium nitride (TiN), tantalum nitride (TaN), or tungsten nitride (WN). The conductive layer 225*b* may include a metal material, such as tungsten (W), titanium (Ti), aluminum (Al), or copper (Cu). The conductive layer 245*b* may be, for example, copper (Cu).

The upper surface of the rear bonding insulating layer 221 may form a bonding interface IF with the upper surface of the rear bonding pad 225 and may be substantially coplanar with the upper surface of the rear bonding pad 225. The rear bonding insulating layer 221 may be formed of different materials among silicon oxide, silicon nitride, silicon carbonitride, and silicon oxycarbonitride.

The second rear structure 220 of the lower second semiconductor chip 200A may be bonded to the second front structure 240 of the upper second semiconductor chip 200B. Similarly, the second rear structure 220 of the lower second semiconductor chip 200B may be bonded and combined with the second front structure 240 of the upper second semiconductor chip 200C. For example, the plurality of second semiconductor chips 200A, 200B, 200C, and 200D may be stacked by directly bonding each second rear structure 220 of a lower semiconductor chip with a second front structure 240 of an upper semiconductor chip.

In an example embodiment, the front bonding pad 245 and the rear bonding pad 225 may have an asymmetrical structure in which at least one of a width and a thickness is different from each other. For example, the rear bonding pad 225 may have a first thickness T1, and the front bonding pad 245 may have a second thickness T2 greater than the first thickness T1. Since the second thickness T2 is greater than the first thickness T2, the front bonding pad 245 and the rear bonding pad 225 may be stably bonded by expansion of a metal material (e.g., copper) without a void or empty space therebetween.

The second through-structure 230 may pass through the second semiconductor layer 201 in a vertical direction (the Z-axis direction) and provide an electrical path connecting to the front bonding pad 245 and the rear bonding pad 225. The second through-structure 230 may include a second spacer 231 and a second through-electrode 232. The second spacer 231 may include or be formed of silicon oxide, silicon oxynitride, silicon nitride, a polymer, or combinations thereof, and may be a single layer or a multilayer layer. As illustrated in FIG. 2A, the second through-electrode 232 may include a conductive plug 232*b* and a barrier layer 232*a* surrounding the conductive plug 232*b*. In an example embodiment, the barrier layer 232*a* may surround an outer surface of the conductive plug 232*b*, but may also cover an upper surface of the conductive plug 232*b* according to embodiments. In this case, the barrier layer 232*a* may be disposed between the rear bonding pad 225 and the conductive plug 232*b*. The barrier layer 232*a* may include or be a metal compound, such as titanium nitride (TiN), tantalum nitride (TaN), or tungsten nitride (WN). The conductive plug 232*b* may include or be, for example, a metal material, such as tungsten (W), titanium (Ti), aluminum (Al), or copper (Cu).

The semiconductor package 1000 according to an example embodiment may further include an encapsulant 500 surrounding the second semiconductor chips 200A, 200B, 200C, and 200D on the first semiconductor chip 100. The encapsulant 500 may be disposed on the first semiconductor chip 100 and may seal at least a portion of each of the second semiconductor chips 200A, 200B, 200C, and 200D. As illustrated in FIG. 1, the encapsulant 500 may be formed to expose an upper surface of the uppermost second semiconductor chip 200D. However, according to embodiments, the encapsulant 500 may be formed to cover an upper surface of the uppermost second semiconductor chip 200D. The encapsulant 500 may include or be formed of, for example, epoxy mold compound (EMC), but the material of the encapsulant 500 is not particularly limited thereto.

Next, modified example of according to example embodiments of the present inventive concept will be described with reference to FIGS. 3A to 10B.

FIGS. 3A, 3B, 4, 5, 6A, 9A, 10A, and 10B are partially enlarged views illustrating semiconductor packages according to example embodiments of the present inventive concept. FIGS. 3A, 3B, 4, 5, 6A, 9A, 10A, and 10B illustrate an enlarged view of a region corresponding to region 'A' in FIG. 1. FIGS. 6B, 7, 8, and 9B are plan views illustrating semiconductor packages according to example embodiments of the present inventive concept. FIGS. 6B, 7, 8, and 9B are diagrams schematically illustrating only wiring pad 243 and front bonding pad 245, which are main components of a semiconductor package according to example embodiments.

Figure 3A:
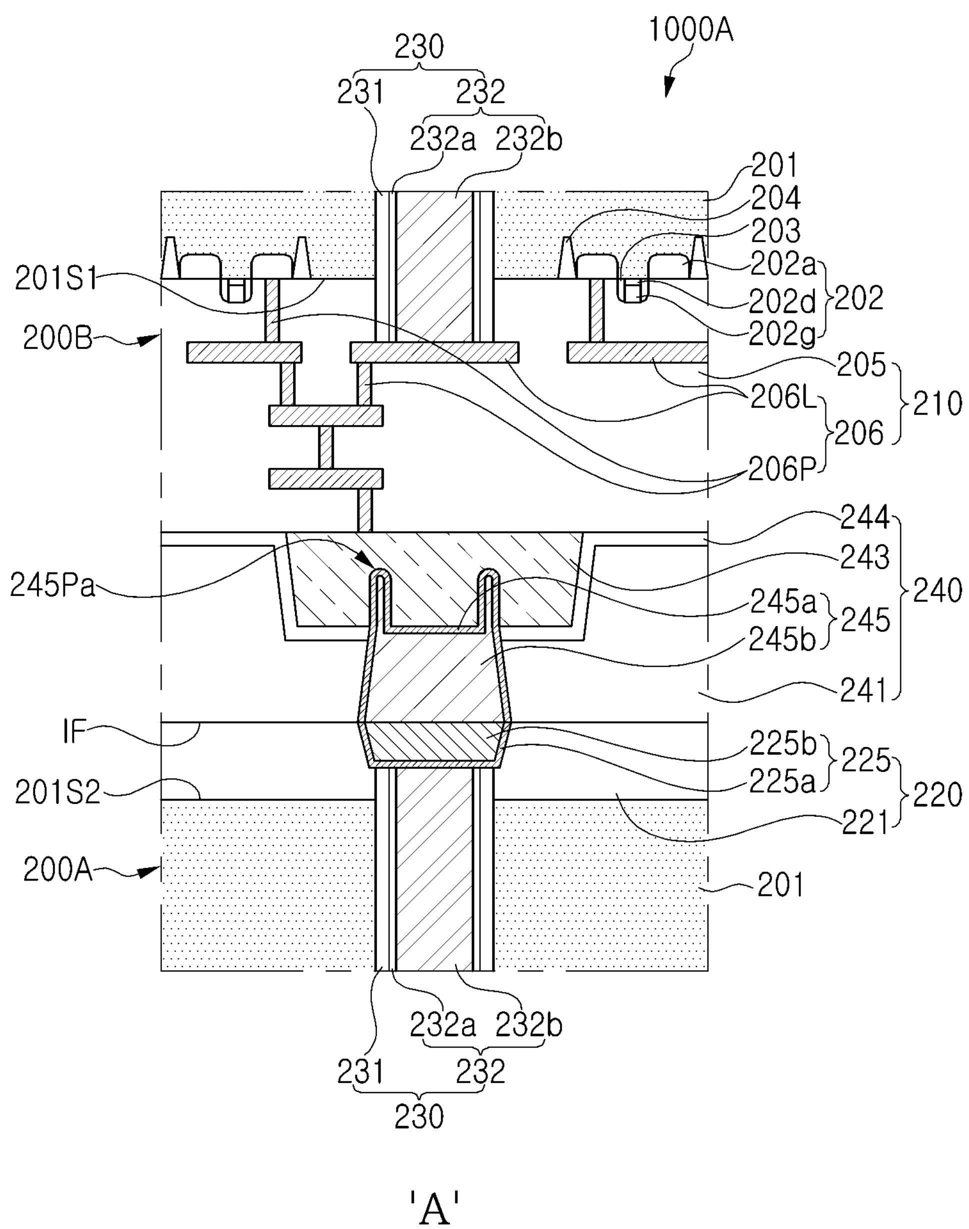
FIGS. 3A, 3B, 4, 5, 6A, 6B, 7, 8, 9A, 9B, 10A, and 10B are partially enlarged views and plan views illustrating a semiconductor package according to example embodiments of the present inventive concept.

Referring to FIG. 3A, in a semiconductor package 1000A, a protrusion 245Pa of the front bonding pad 245 may extend to have a relatively deep depth. A thickness (e.g., height) of the protrusion 245Pa may be greater than a width of the protrusion 245Pa. As a width (or planar area) of the front bonding pad 245 decreases due to high integration of semiconductor packages, the thickness of the protrusion 245Pa may be relatively increased to increase an interface area between the front bonding pad 245 and the wiring pad 243. However, even in this case, an upper end of the protrusion 245Pa may contact the wiring pad 243 without passing through the wiring pad 243. According to some embodiments, the thickness of the protrusion 245Pa may be, for example, 2 to 5 times the width of the protrusion 245Pa.

Figure 3B:
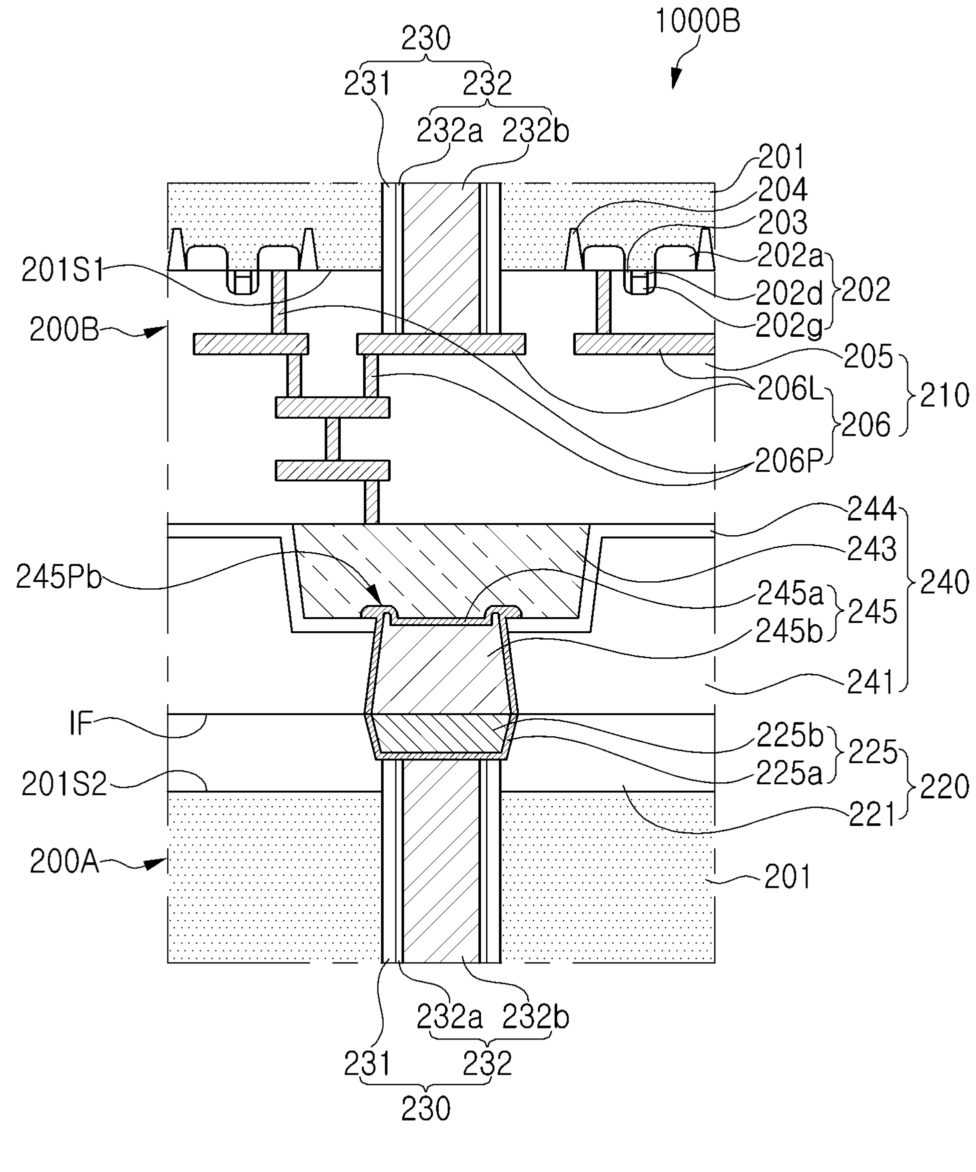

Referring to FIG. 3B, in a semiconductor package 1000B, a protrusion 245Pb of the front bonding pad 245 may include a portion extending between the passivation layer 244 and the wiring pad 243. The barrier layer 245*a* and the conductive layer 245*b*, which form the protrusion 245Pb, may have different shapes. The barrier layer 245*a* may extend laterally toward a space between the passivation layer 244 and the wiring pad 243, while the conductive layer 245*b* may not. However, the shapes of the protrusion 245Pb and the adjacent passivation layer 244 are not limited thereto and may be variously changed according to process conditions of an etching process for forming a recess portion corresponding to the protrusion 245Pb.

Figure 4:
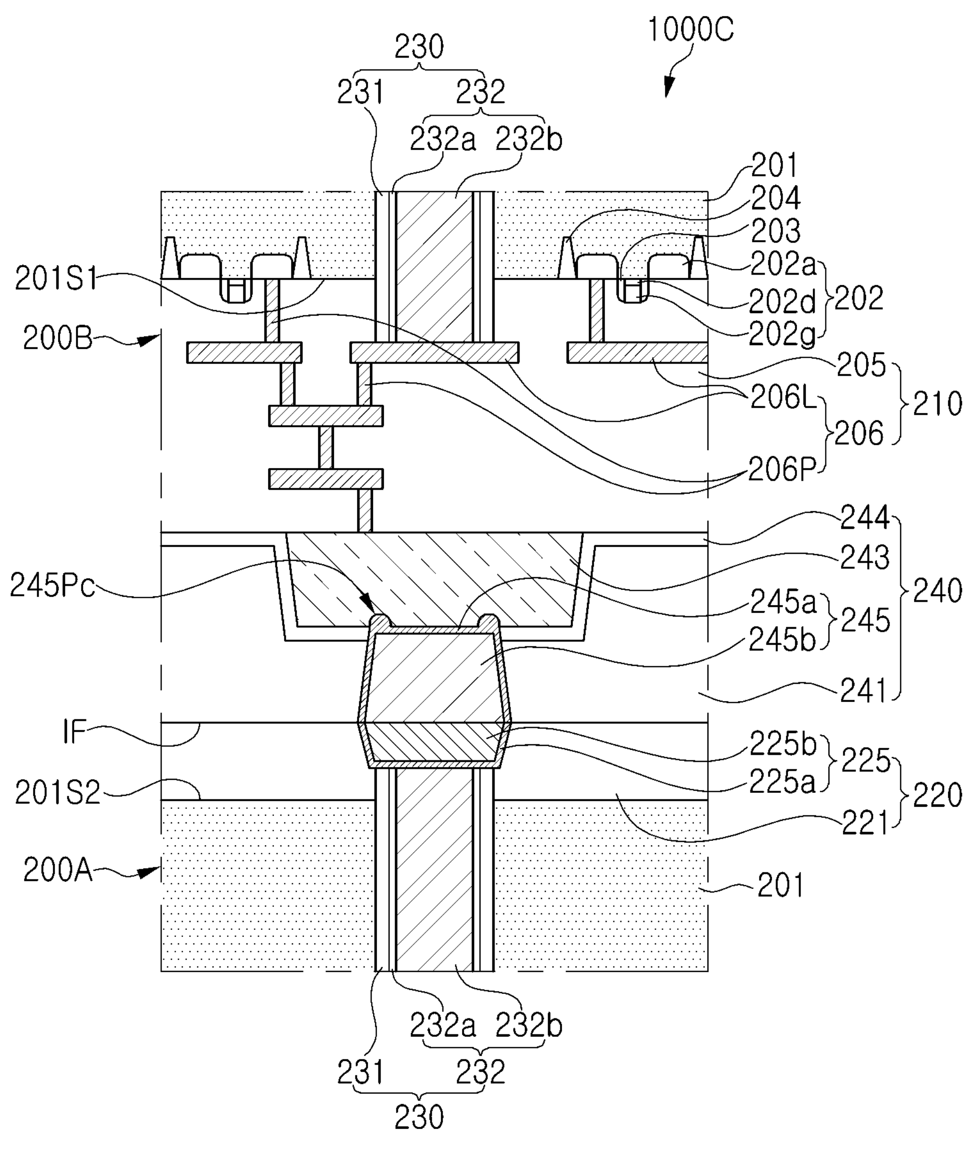

Referring to FIG. 4, in a semiconductor package 1000C, a protrusion 245Pc of the front bonding pad 245 may be filled only with a barrier layer 245*a*, unlike the protrusion 245P of FIG. 2A. The barrier layer 245*a* may not have a substantially uniform thickness as it completely fills the protrusion 245P.

Figure 5:
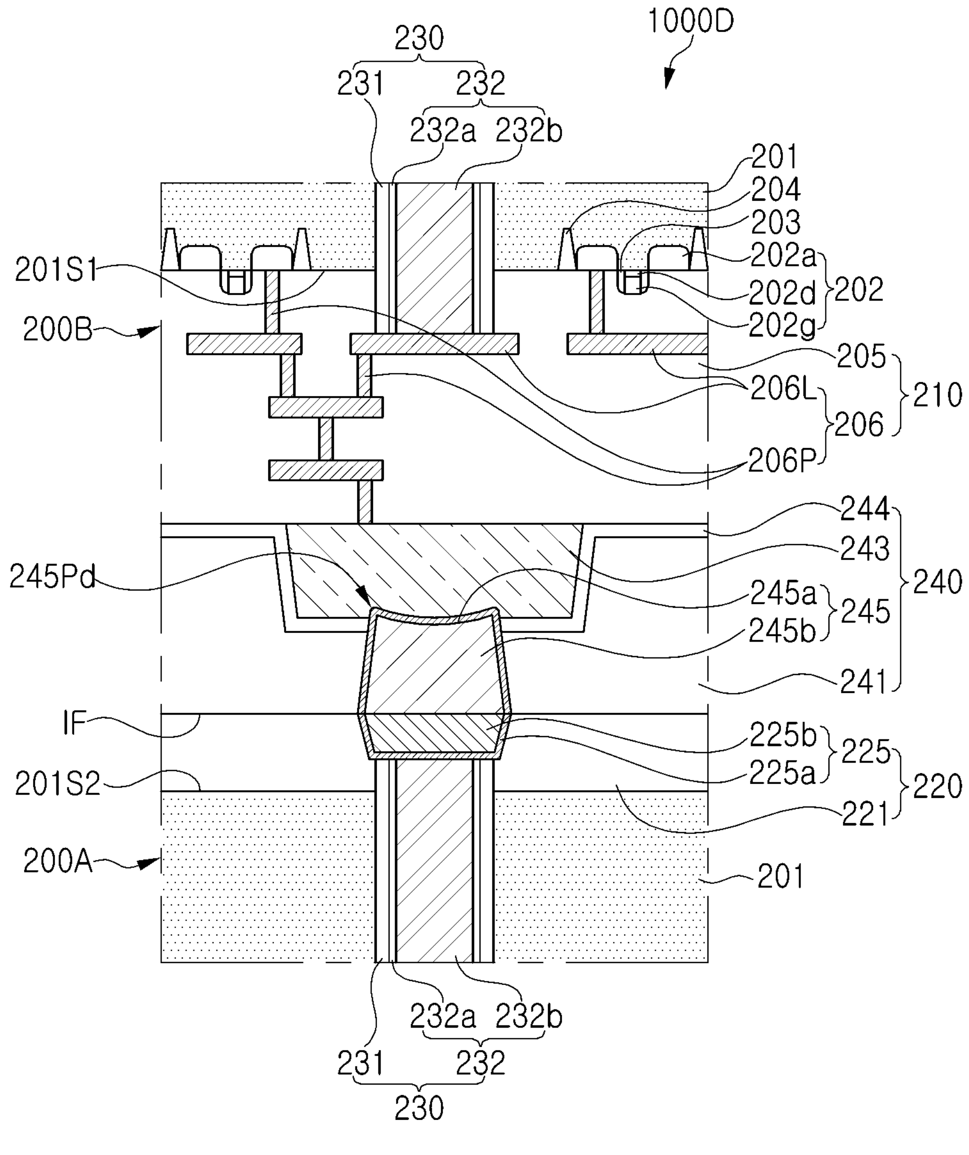

Referring to FIG. 5, in a semiconductor package 1000D, an upper surface of the front bonding pad 245 may have a concave shape toward the wiring pad 243. The front bonding pad 245 may include a central region 245C and an outer region 245O surrounding the central region 245C (see FIG. 2B, for example), and a height of an upper end of the central region 245C may be lower than a height of an upper end of the outer region 245O. However, the upper surface of the front bonding pad 245 may have an upper surface structure having a continuous slope or continuous curved arc, unlike the upper surface structure having the protrusion 245P of FIG. 2A.

Figure 6A:
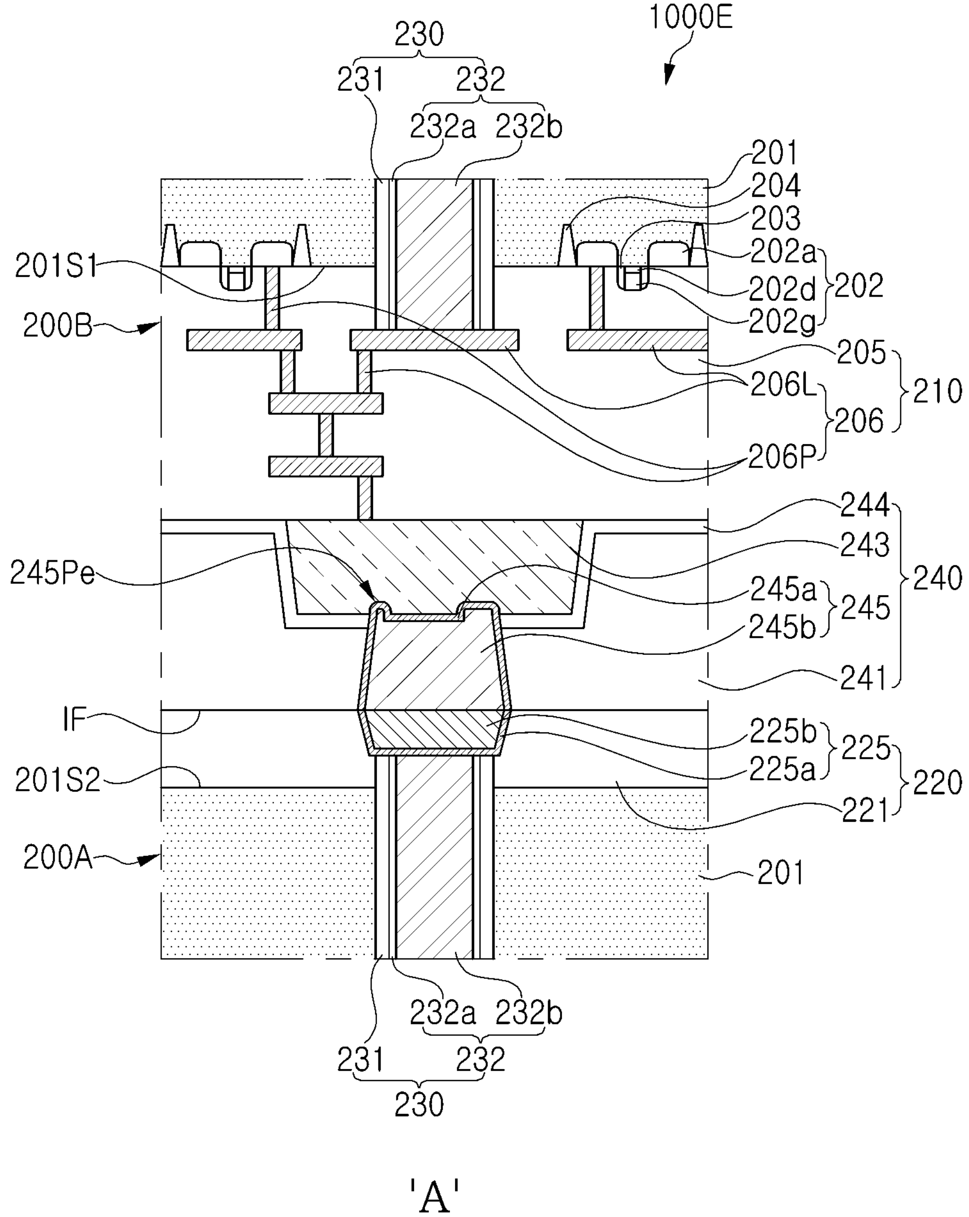
Figure 6B:
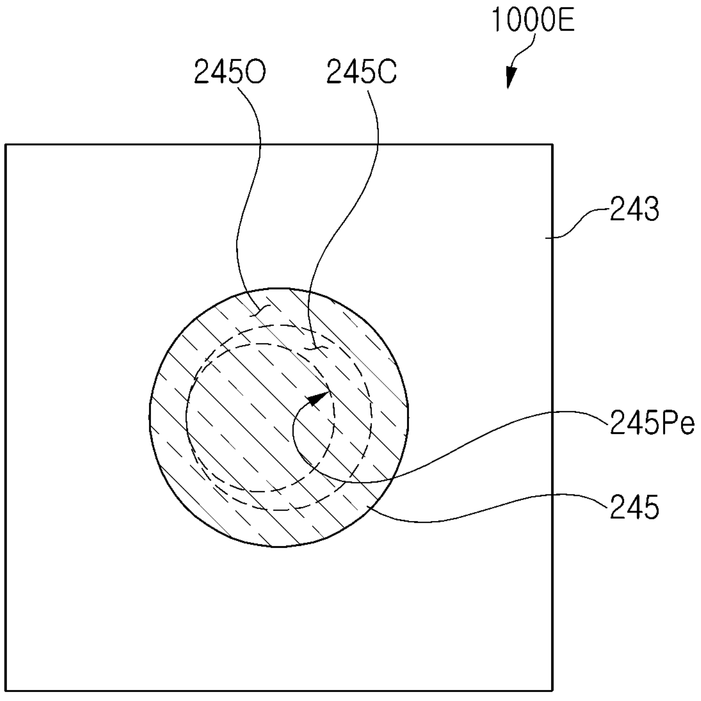

Referring to FIGS. 6A and 6B, in a semiconductor package 1000E, a protrusion 245Pe of the front bonding pad 245 may have an asymmetrical shape. The protrusion 245Pe may have an asymmetrical shape from the central axis of the front bonding pad 245 in the Z-direction. For example, the protrusion 245Pe may have an annular shape having an irregular thickness. This may be a structure formed as a mask is misaligned in a patterning process for forming the protrusion 245Pe.

Figure 7:
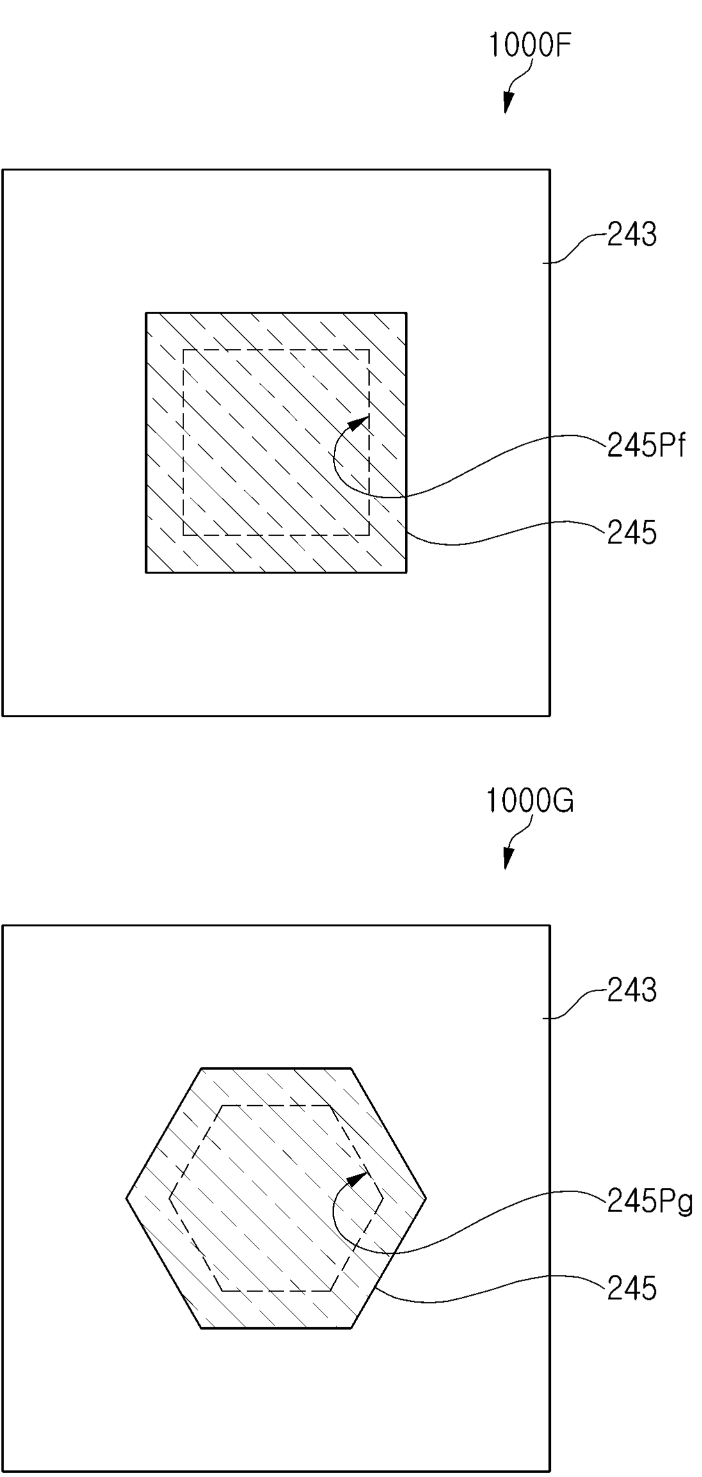

Referring to FIG. 7, the front bonding pad 245 may have a polygonal structure, such as a quadrangle or a hexagon in plan view. However, even in this case, the front bonding pad 245 may be positioned within the wiring pad 243 in plan view. In addition, protrusions 245Pf and 245Pg may have an annular shape of a polygonal structure along the outer surface of the front bonding pad 245.

Figure 8:
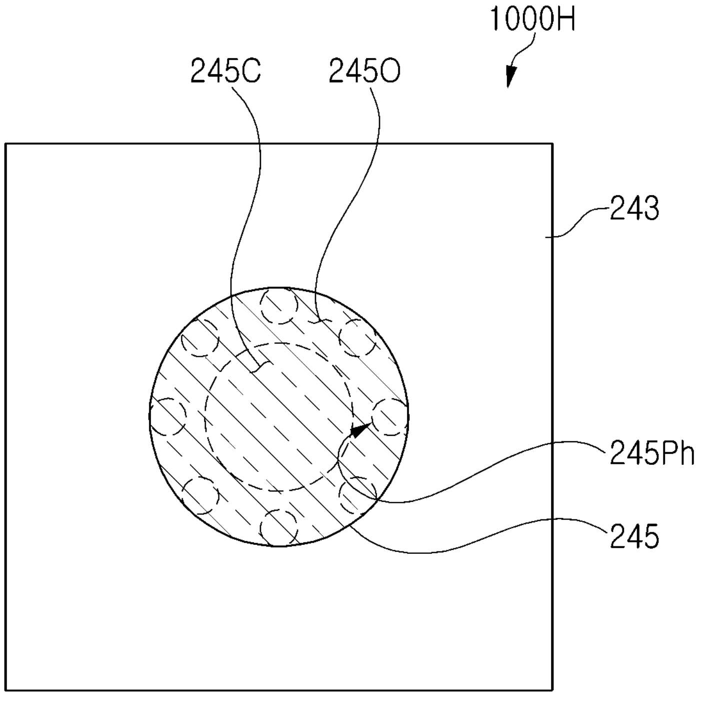

Referring to FIG. 8, in a semiconductor package 1000H, a protrusion 245Ph may include a plurality of projections spaced apart from each other along an outer region 245O. That is, unlike the protrusion 245P of FIG. 2A having an annular shape, a plurality of the projections having a hole-type structure may be arranged. The hole is illustrated to have a circular shape, but is not limited thereto and may be changed into various shapes, such as an oval shape and a square shape. In an example embodiment, the plurality of projections may be spaced apart from each other at regular intervals, but may be arranged in various manners.

As the protrusion 245Ph is formed to have the plurality of projections, a contact area between the front bonding pad 245 and the wiring pad 243 relatively increases, thereby providing a semiconductor package having improved reliability.

Figure 9A:
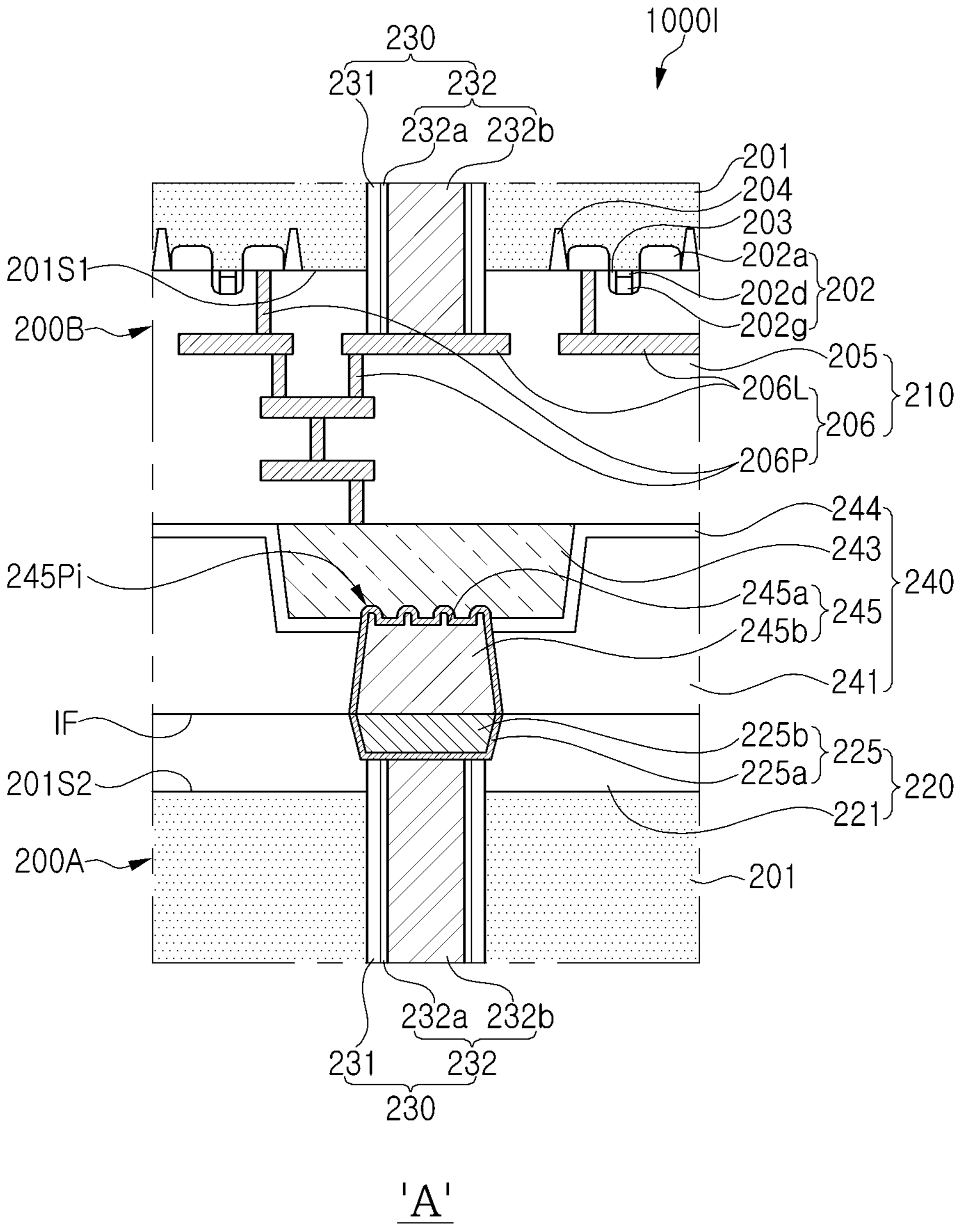
Figure 9B:
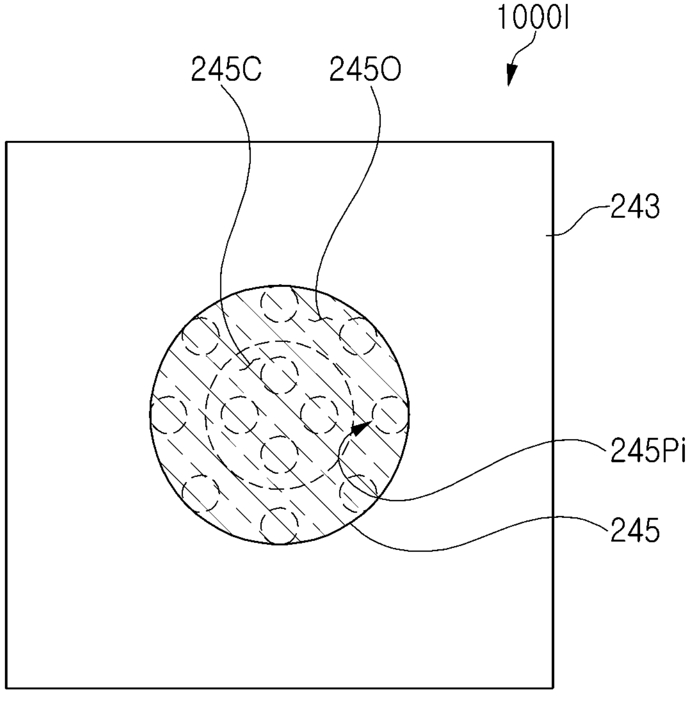

Referring to FIGS. 9A and 9B, in a semiconductor package 1000I, a protrusion 245Pi may include a plurality of projections spaced apart from each other similarly to those described above with reference to FIG. 8, but the plurality of projections may be arranged in both outer region 245O and the central region 245C. An arrangement relationship in which the plurality of projections are arranged may be variously changed according to embodiments.

Figure 10A:
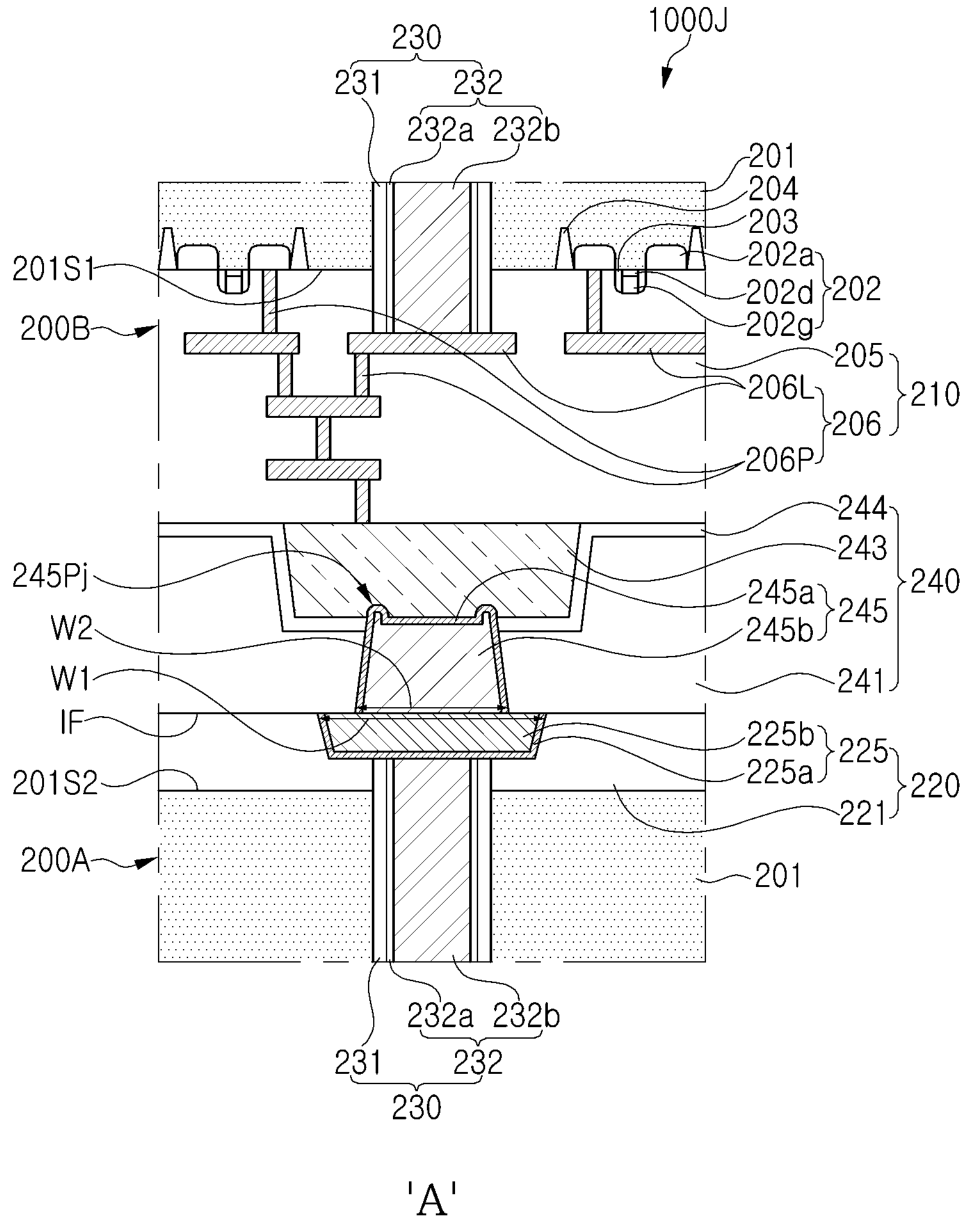

Referring to FIG. 10A, in a semiconductor package 1000J, the front bonding pads 245 and rear bonding pads 225 may have different widths, particularly on their surfaces that face each other, but in some cases throughout both bonding pads.

The rear bonding pad 225 may have a first width W1, and the front bonding pad 245 may have a second width W2 greater than the first width W1. According to the present embodiment, since the first width W1 is greater than the second width W2, an alignment margin of the front bonding pad 245 and the rear bonding pad 225 may be secured.

Figure 10B:
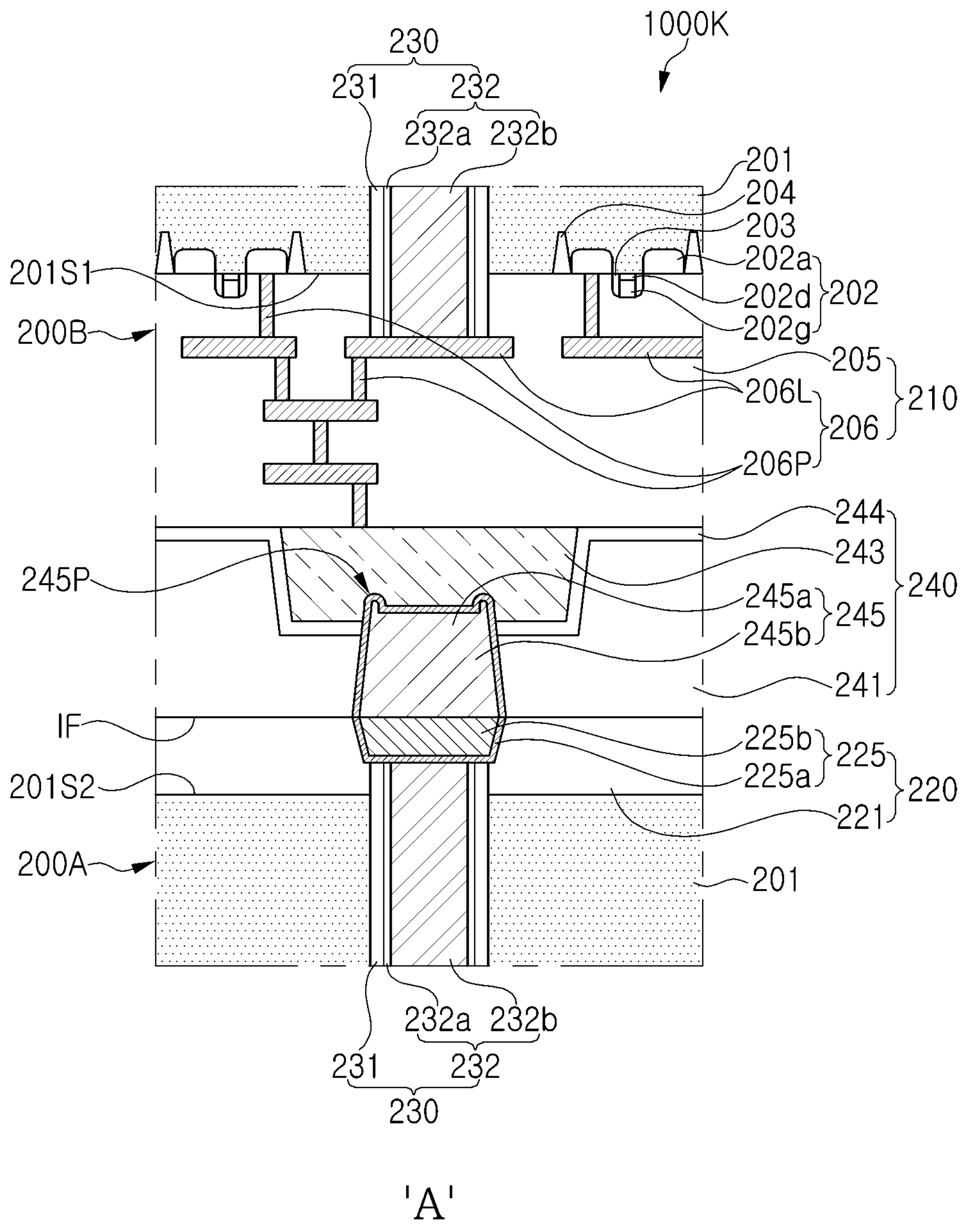

Referring to FIG. 10B, in a semiconductor package 1000K, a front bonding pad 245 may recess a lower portion of the wiring pad 243. The front bonding pad 245 may have an upper surface including a first surface that is a surface of the protrusion and a second surface extending from the first surface, and the second surface may be located at a level higher than that of the lower surface of the wiring pad 243. This may be a structure formed as the lower portion of the wiring pad 243 is partially removed by an etching process in the process of forming an opening by etching the second front insulating layer 211.

Figure 11:
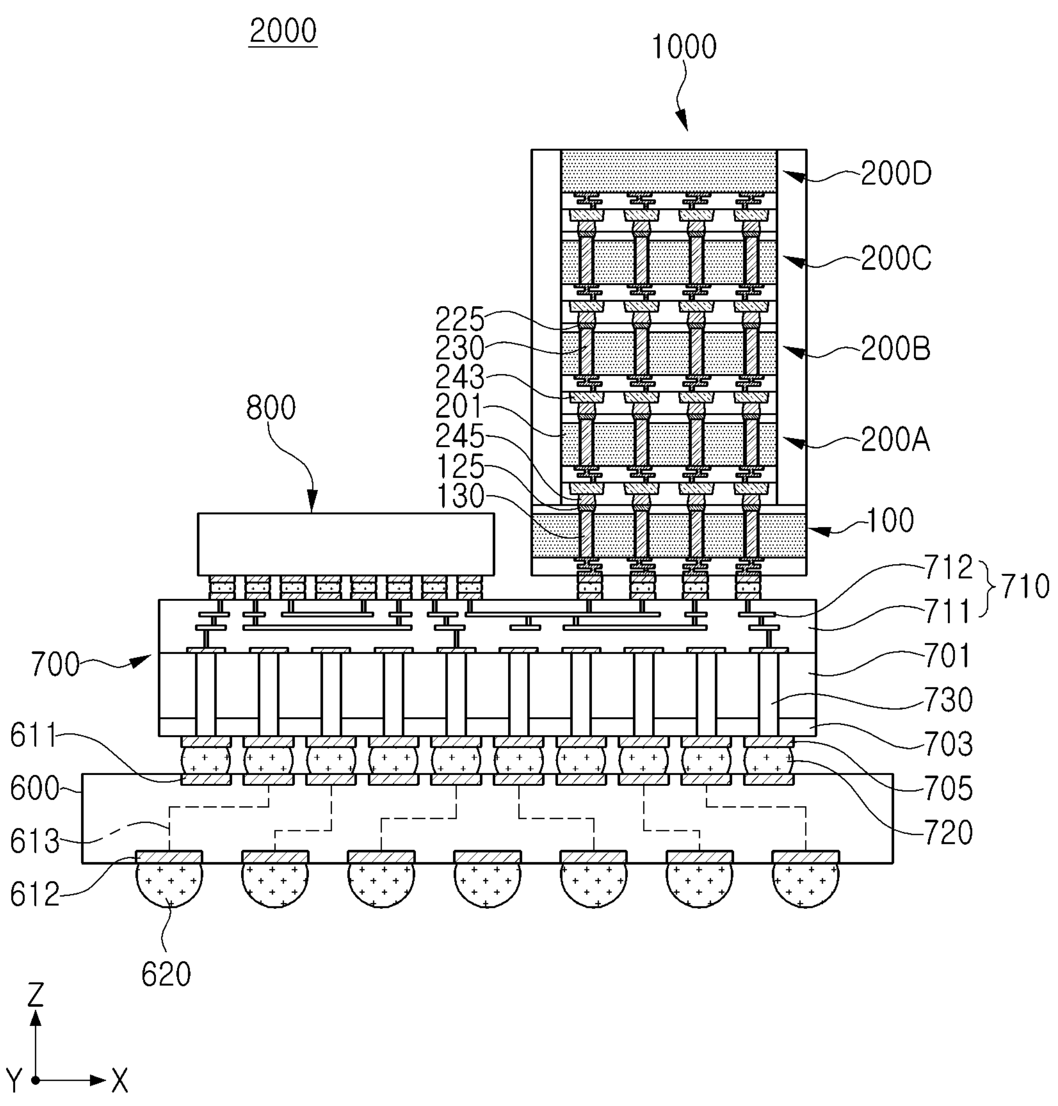
FIG. 11 is a cross-sectional view illustrating a semiconductor package according to example embodiments of the present inventive concept.

FIG. 11 is a cross-sectional view illustrating a semiconductor package according to example embodiments of the present inventive concept.

Referring to FIG. 11, a semiconductor package 2000 according to example embodiments may include a package substrate 600, an interposer substrate 700, and at least one chip structure 1000. In addition, the semiconductor package 2000 may further include a logic chip or processor chip 800 disposed to be adjacent to the chip structure 1000 on the interposer substrate 700.

The package substrate 600 may include a lower pad 612 disposed on a lower surface of the body, an upper pad 611 disposed on an upper surface of the body, and a redistribution circuit 613 electrically connecting the lower pad 612 to the upper pad 611. The package substrate 600 may be a support substrate on which the interposer substrate 700, the logic chip 800, and the chip structure 1000 are mounted, and may be a substrate for a semiconductor package including a printed circuit board (PCB), a ceramic substrate, a glass substrate, a tape wiring board, and the like. The body of the package substrate 600 may include different materials depending on the type of substrate. For example, when the package substrate 600 is a PCB, the package substrate 600 may be a form in which a wiring layer is additionally stacked on one or both surfaces of a body copper-clad laminate or a copper-clad laminate. Solder resist layers may be formed on lower and upper surfaces of the package substrate 600, respectively. The lower and upper pads 612 and 611 and the redistribution circuit 613 may form an electrical path connecting the lower and upper surfaces of the package substrate 600. The lower and upper pads 612 and 611 and the redistribution circuit 613 may include or be formed of a metal material, for example, at least one of copper (Cu), aluminum (Al), nickel (Ni), silver (Ag), gold (Au), platinum (Pt), tin (Sn), lead (Pb), titanium (Ti), chromium (Cr), palladium (Pd), indium (In), zinc (Zn), and carbon (C) or an alloy including two or more metals. The redistribution circuit 613 may include multiple redistribution layers and a via connecting them. An external connection terminal 620 connected to the lower pad 612 may be disposed on a lower surface of the package substrate 600. The external connection terminal 620 may include or be formed of one or more of tin (Sn), indium (In), bismuth (Bi), antimony (Sb), copper (Cu), silver (Ag), zinc (Zn), lead (Pb), and/or alloys thereof. The interposer substrate 700 may include a substrate body 701, a lower passivation layer 703, a lower pad 705, an interconnection structure 710, a metal bump 720, and a through-via 730. The chip structure 1000 and the processor chip 800 may be stacked on the package substrate 600 via the interposer substrate 700. The interposer substrate 700 may electrically connect the chip structure 1000 and the processor chip 800 to each other.

The substrate body 701 may be formed of, for example, any one of silicon, organic, plastic, and glass substrates. When the substrate body 701 is a silicon substrate, the interposer substrate 700 may be referred to as a silicon interposer. Also, when the substrate body 701 is an organic substrate, the interposer substrate 700 may be referred to as a panel interposer.

A lower protective layer 703 may be disposed on a lower surface of the substrate body 701, and a lower pad 705 may be disposed on the lower protective layer 703. The lower pad 705 may be connected to the through-via 730. The chip structure 1000 and the processor chip 800 may be electrically connected to the package substrate 600 through the metal bumps 720 disposed on the lower pad 705.

The interconnection structure 710 may be disposed on the upper surface of the substrate body 701 and may include an interlayer insulating layer 711 and a single-layer or multilayer wiring structure 712. When the interconnection structure 710 has a multilayer wiring structure, wiring patterns of different layers may be connected to each other through contact vias.

The through-via 730 may extend from the upper surface to the lower surface of the substrate body 701 and pass through the substrate body 701. Also, the through-via 730 may extend into the interconnection structure 710 and be electrically connected to wirings of the interconnection structure 710. When the substrate body 701 is silicon, the through-vias 730 may be referred to as TSVs. Other structures and materials of the through-via 730 may be the same as those described for the semiconductor package 1000 of FIG. 1. Depending on embodiments, the interposer substrate 700 may include only interconnection structures therein and may not include through-vias.

The interposer substrate 700 may be used for the purpose of converting or transmitting an input electrical signal between the package substrate 600 and the chip structure 1000 or the processor chip 800. Accordingly, the interposer substrate 700 may not include devices, such as active devices or passive devices. Also, according to embodiments, the interconnection structure 710 may be disposed below the through-via 730. For example, a positional relationship between the interconnection structure 710 and the through-via 730 may be relative.

The metal bump 720 may be disposed on the lower surface of the interposer substrate 700 and electrically connected to a wiring of the interconnection structure 710. The interposer substrate 700 may be stacked on the package substrate 600 through the metal bump 720. The metal bump 720 may be connected to the lower pad 705 through the wirings of the interconnection structure 710 and the through-via 730. In an example, some of the lower pads 705 used for power or ground may be integrated and connected to the metal bump 720, so that the number of lower pads 705 may be greater than the number of metal bumps 720.

The logic chip or processor chip 800 may include, for example, a central processing unit (CPU), a graphics processing unit (GPU), a field programmable gate array (FPGA), a digital signal processor (DSP), a cryptographic processor, a microprocessor, a microcontroller, an analog-to-digital converter (ADC), an application-specific IC (ASIC), and the like. Depending on the type of devices included in the logic chip or processor chip 800, the semiconductor package 2000 may be referred to as a server-oriented semiconductor package or a mobile-oriented semiconductor package.

The chip structure 1000 may have characteristics similar to or the same as those of the semiconductor package 1000 described above with reference to FIGS. 1 to 10B. For example, the chip structure 1000 may be a structure in which the first semiconductor chip 100 and the second semiconductor chips 200A, 200B, 200C, and 200D are directly bonded, the rear bonding pad 225 and the front bonding pad 245 of the second semiconductor chips 200A, 200B, 200C, and 200D may be directly bonded, and the front bonding pad 245 may include a protrusion 245P protruding toward the wiring pad 243.

The semiconductor package 2000 may further include an internal encapsulant covering side and upper surfaces of the chip structure 1000 and the processor chip 800 on the interposer substrate 700. In addition, the semiconductor package 2000 may further include an outer encapsulant covering the interposer substrate 700 and the inner encapsulant on the package substrate 600. The outer encapsulant and the inner encapsulant may be formed together and in one embodiment are not distinguished from each other. According to example embodiments, the semiconductor package 2000 may further include a heat dissipation plate covering the chip structure 1000 and the processor chip 800 on the package substrate 600.

Figure 12:
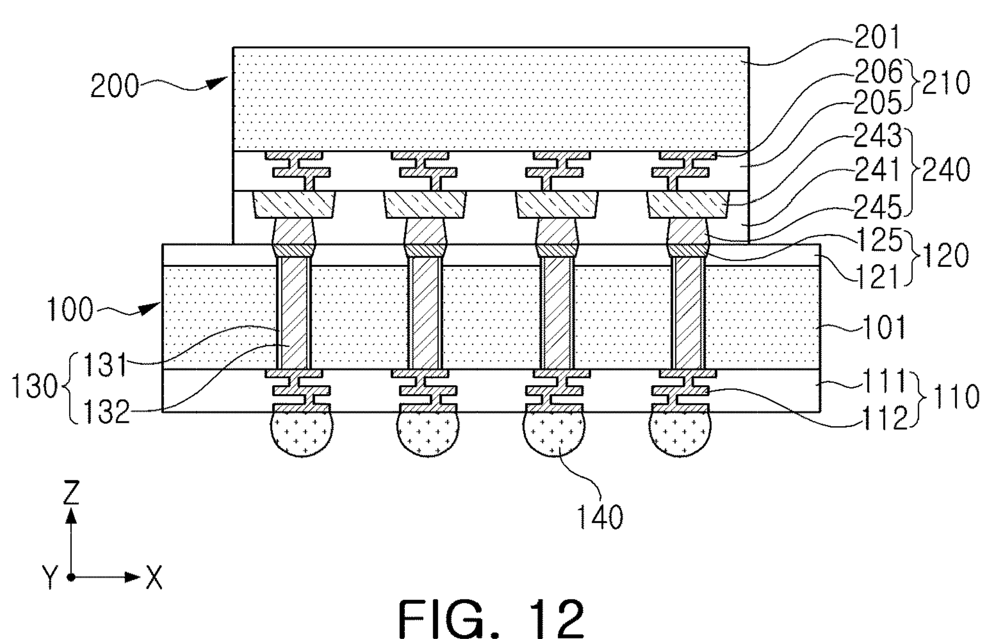
FIG. 12 is a cross-sectional view illustrating a semiconductor package according to example embodiments of the present inventive concept.

FIG. 12 is a cross-sectional view illustrating a semiconductor package according to an example embodiment.

Referring to FIG. 12, a semiconductor package 3000A may include a first semiconductor chip 100 and a second semiconductor chip 200 stacked in a vertical direction. The first semiconductor chip 100 and the second semiconductor chip 200 may be coupled by direct bonding without a separate connecting member. Since a structure of the first semiconductor chip 100 is the same as that of the first semiconductor chip 100 of FIGS. 1 and 2A, a description thereof will be omitted. However, the first device layer 110 of the first semiconductor chip 100 may include individual devices, and the individual devices may include FETs, such as planar FETs and FinFETs, flash memories, memory devices, such as DRAMs, SRAMs, EEPROMs, PRAM, MRAM, FeRAM, and RRAM, logic devices, such as AND, OR, and NOT, and various active and/or passive devices, such as system LSI, CIS, and MEMS. The second semiconductor chip 200 may include a single chip and may not include the second through-structure 230. However, the second semiconductor chip 200 may have a second semiconductor layer 201 and a second front structure 240 similar to those described above with reference to FIGS. 1 and 2A, and the second front structure 240 may be bonded to the first rear structure 120 of the first semiconductor chip 100. In an example embodiment, the second semiconductor chip 200 may be a chiplet constituting a multi-chip module (MCM), but it is not limited thereto.

Figure 13:
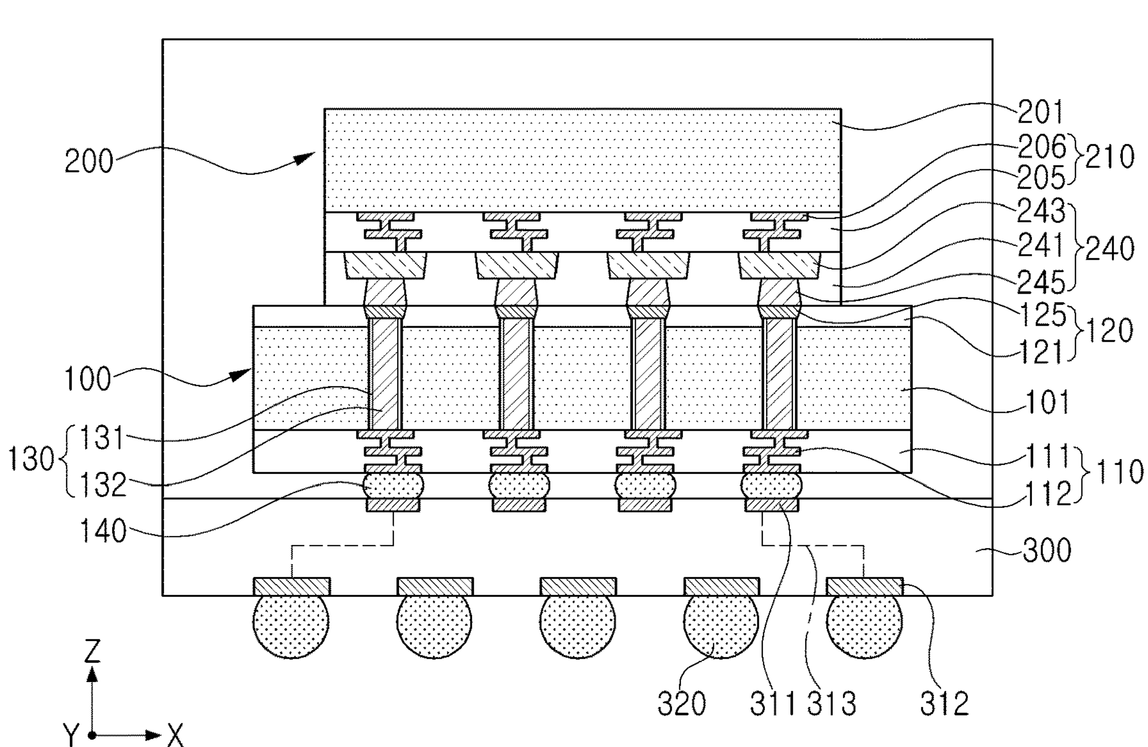
FIG. 13 is a cross-sectional view illustrating a semiconductor package according to example embodiments of the present inventive concept.

FIG. 13 is a cross-sectional view illustrating a semiconductor package according to an example embodiment.

Referring to FIG. 13, a semiconductor package 3000B may have characteristics that are the same as or similar to those described above with reference FIG. 12, except that the semiconductor package 3000B further includes a package substrate 300 on which the first semiconductor chip 100 is mounted and an encapsulant 260 encapsulates the first semiconductor chip 100 and the second semiconductor chip 200 on the package substrate 300.

As an example, the first semiconductor chip 100 may be a logic chip including, for example, a CPU, a GPU, an FPGA, an AP, a DSP, a cryptographic processor, a microprocessor, a microcontroller, an ADC, an ASIC, and the like. Also, the second semiconductor chip 200 may include a memory chip, such as DRAM, SRAM, PRAM, MRAM, FeRAM, or RRAM. In the present embodiment, the second semiconductor chip 200 is illustrated to be the same as that of FIG. 12, but may have a shape similar to that described above with reference to FIGS. 1 to 10B. For example, the second semiconductor chip 200 may include a power management IC (PMIC) chip.

Figure 14A:
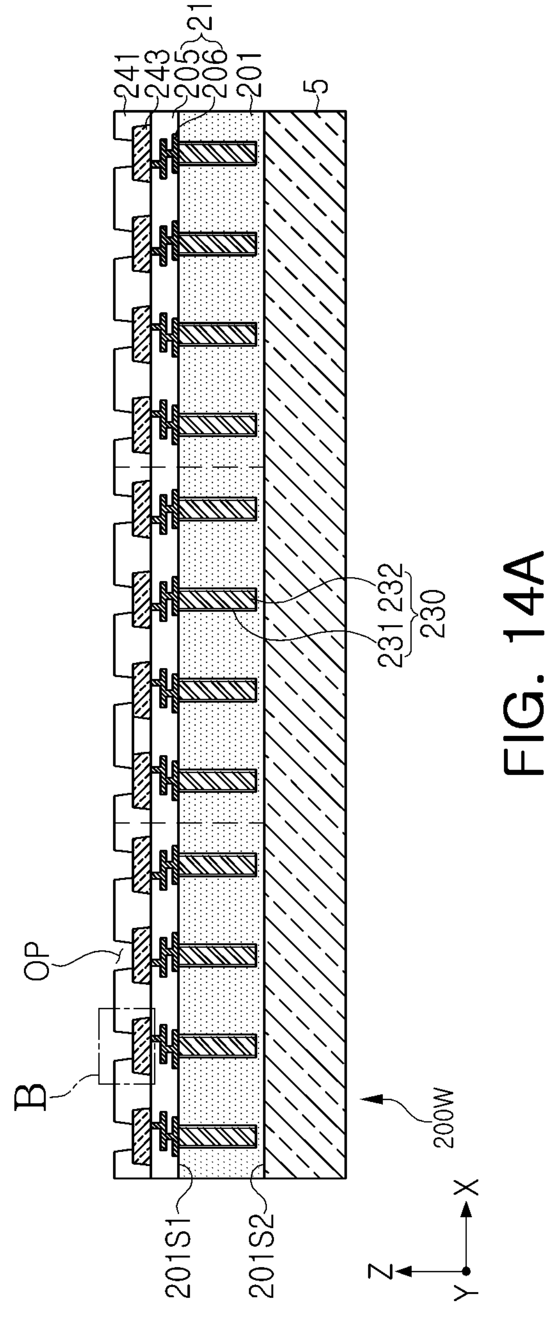
FIGS. 14A to 14G are cross-sectional views sequentially illustrating a manufacturing process of a semiconductor chip according to example embodiments of the present inventive concept.
Figure 14B:
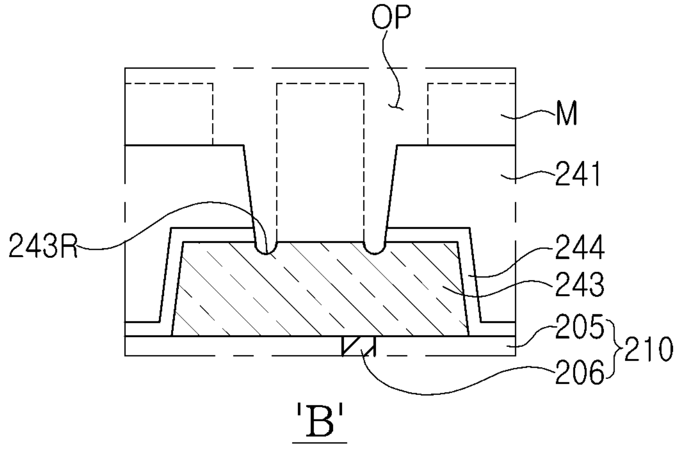
Figure 14C:
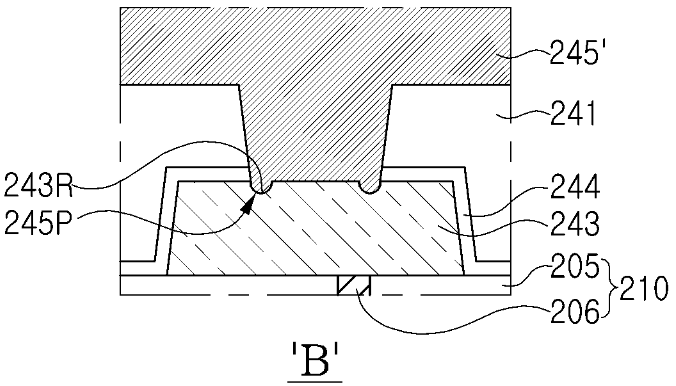

FIGS. 14A to 14G are cross-sectional views sequentially illustrating a manufacturing process of a semiconductor chip according to an example embodiment of the present inventive concept. FIGS. 14A to 14G illustrate a process of dicing a wafer to form a plurality of semiconductor chips including a second semiconductor chip, and FIGS. 14B and 14C are enlarged views of region 'B' of FIG. 14A.

Referring to FIG. 14A, an opening OP exposing the wiring pad 243 may be formed.

First, a second semiconductor wafer 200W for the plurality of second semiconductor chips 200 may be temporarily bonded to be supported by a first carrier 5 using a bonding material layer. The second semiconductor wafer 200W may include a second front surface 201S1 and a second rear surface 201S2 and may be bonded so that the second rear surface 201S2 faces the first carrier 10.

On the first front surface 201S1 of the first semiconductor wafer 201S1, second ICs including transistors 202 (refer to FIG. 2A), a second wiring structure 206 connected to the transistors 202, and the second interlayer insulating layer 205 covering the second wiring structure 206 may be formed to form the second device layer 210, and a conductive material may be deposited in the via extending from the front surface 201S1 of the second semiconductor layer 201 to form the second through-structure 230. The second through-structure 230 may be formed to have a depth that does not completely pass through the second semiconductor wafer 200W. The second through-structure 230 may be formed to have a via-middle structure, for example. However, the structure of the second through-structure 230 is not limited thereto, and may be formed to have a via-first or via-last structure. The via-first structure may refer to a structure in which the second through-structure 230 is first formed before the individual devices of the second device layer 210 are formed, the via-middle structure may refer to a structure in which the second through-structure 230 is formed before the second device layer 210 is formed after the individual devices are formed, and the via-last structure may refer to a structure in which the second through-structure 230 is formed after the second device layer 21 is entirely formed.

Next, a portion of the front bonding insulating layer 241 covering the second device layer 210 may be deposited and formed, and the wiring pad 243 may be formed through a patterning process. A thickness of the wiring pad 243 may be adjusted to be thicker than the thickness of the wiring pattern 206L (FIG. 2A) of the wiring structure 206 by adjusting the thickness of the front bonding insulating layer 241 deposited in this process. After a portion of the front bonding insulating layer 241 is further formed to cover the upper surface of the wiring pad 243, a patterning process may be performed to form an opening OP exposing at least a portion of the upper surface of the wiring pad 243 through the front bonding insulating layer 241. A width (or planar area) of the opening OP may be smaller than a width (or planar area) of the wiring pad 243. According to embodiments, in this process, an upper region of the front bonding insulating layer 241 may be formed by a separate deposition process using a material different from that of the rest of the region.

Referring to FIG. 14B, a recess portion 243R may be formed by removing a portion of the wiring pad 243.

An etching process using the mask M may be performed to remove a portion of the wiring pad 243 from the upper surface of the wiring pad 243 exposed through the opening OP to form the recess portion 243R. In an example embodiment, the mask M may be formed to have a size smaller than a diameter of the opening OP within the opening OP, and a central axis of the opening OP is disposed to match a central axis of the mask M, thereby forming the recess portion 243R having an annular shape or a ring shape. However, according to embodiments, the shape, size, and arrangement relationship of the recess portion 243R may be variously changed according to the type of mask M or process conditions of an etching process. For example, the semiconductor packages 1000H and 1000I of FIGS. 8 to 9B may be provided by changing the shape of a portion of the mask M disposed in the opening OP.

Referring to FIG. 14C, a preliminary front bonding pad 245' may be formed.

The preliminary front bonding pad 245' may be formed by filling the opening OP and the recess portion 243R with a conductive material, while depositing the conductive material on the front bonding insulating layer 241. The conductive material may include or be a metal compound, such as titanium nitride (TiN), tantalum nitride (TaN), or tungsten nitride (WN) and/or a metal material, such as tungsten (W), titanium (Ti), aluminum (Al), or copper (Cu).

In this process, the preliminary front bonding pad 245' may be formed by sequentially depositing the metal compound material and the metal material, and may be formed of the barrier layer 245*a* and the conductive layer 245*b* through a subsequent process.

Figure 14D:
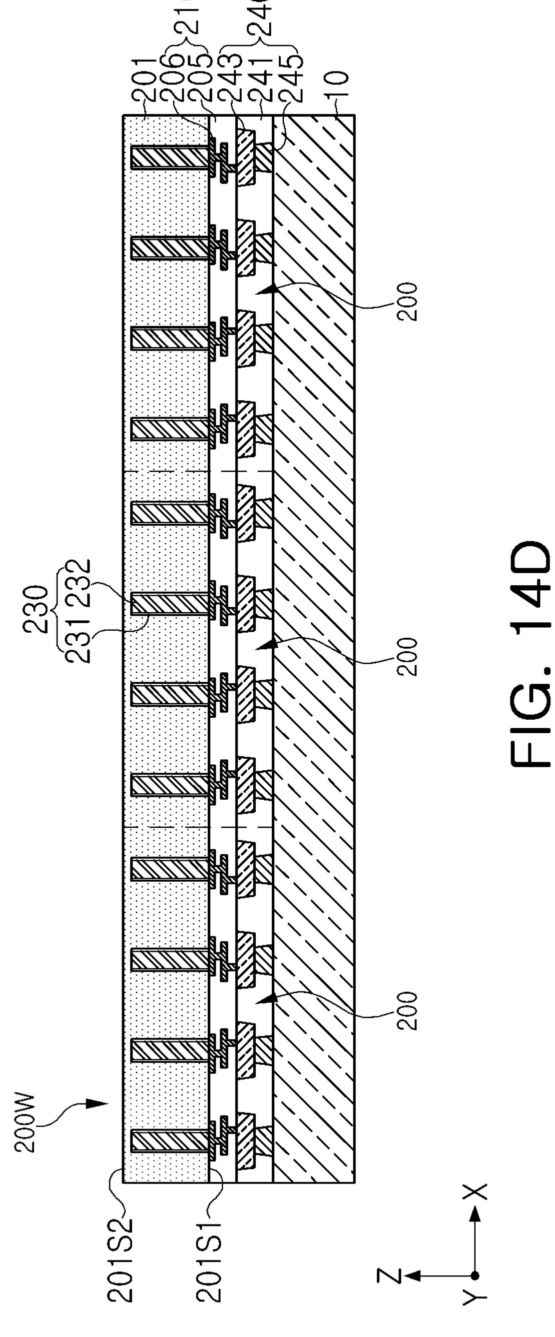

Referring to FIG. 14D, the front bonding pads 245 may be formed and the second semiconductor wafer 200W may be temporarily bonded to a second carrier 10.

The front bonding pad 245 may be formed by removing a portion of the preliminary front bonding pad 245' by performing a planarization process so that the upper surface of the front bonding insulating layer 241 is exposed.

Next, the front bonding pad 245 and the front bonding insulating layer 241 disposed on the second front surface 201S1 of the second semiconductor layer 201 may be temporarily bonded to the second carrier 10. The upper surface of the front bonding pad 245 and the upper surface of the front bonding insulating layer 241 may be temporarily bonded to be supported by the second carrier 10 by a bonding material layer, such as glue. The first carrier 5 on the second rear surface 201S2 of the second semiconductor layer 201 may be removed.

Figure 14E:
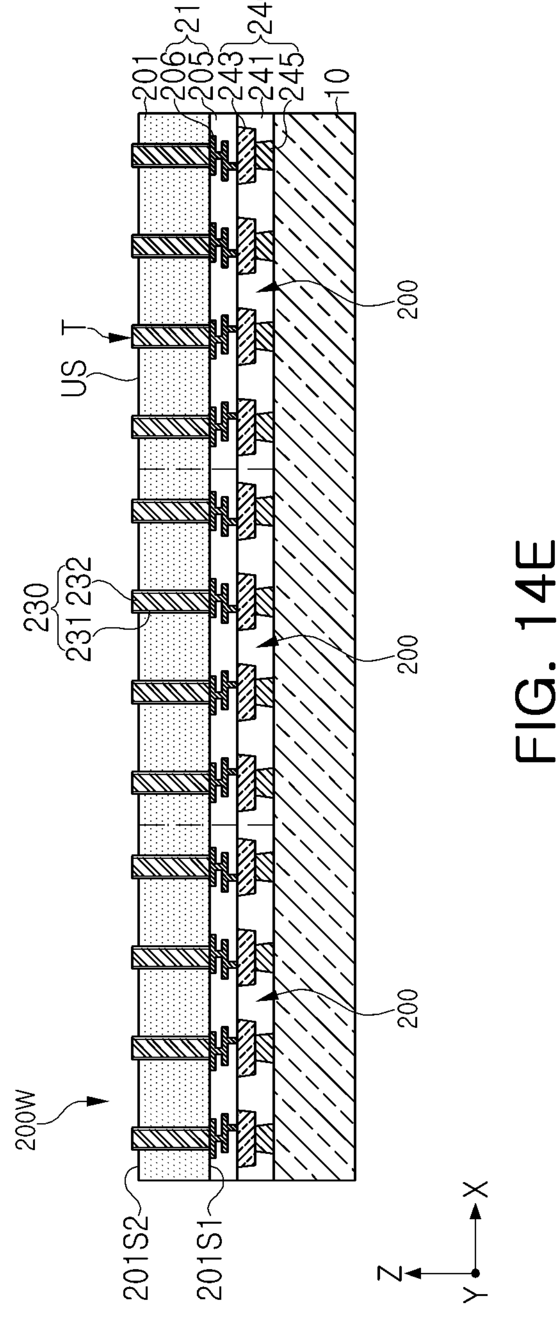

Referring to FIG. 14E, a polishing process may be performed on the upper surface of the second semiconductor wafer 200W to reduce a thickness of the second semiconductor wafer 200W. Accordingly, an upper surface US of the second semiconductor wafer 200W may be formed to be lower than an upper end T of the second through-structures 230. As a portion of the second semiconductor wafer 200W is removed, the upper end T of the second through-structures 230 may protrude from the upper surface US of the second semiconductor wafer 200W. Through the polishing process, the thickness of the second semiconductor wafer 200W may be reduced to a desired thickness of the second semiconductor chips 200. As the polishing process, a grinding process, such as a chemical mechanical polishing (CMP) process, an etch-back process, or combinations thereof may be used. For example, the second semiconductor wafer 200W may be reduced to have a certain thickness by performing a grinding process, and the second through-hole structures 230 may be sufficiently exposed by applying etch-back under appropriate conditions.

Figure 14F:
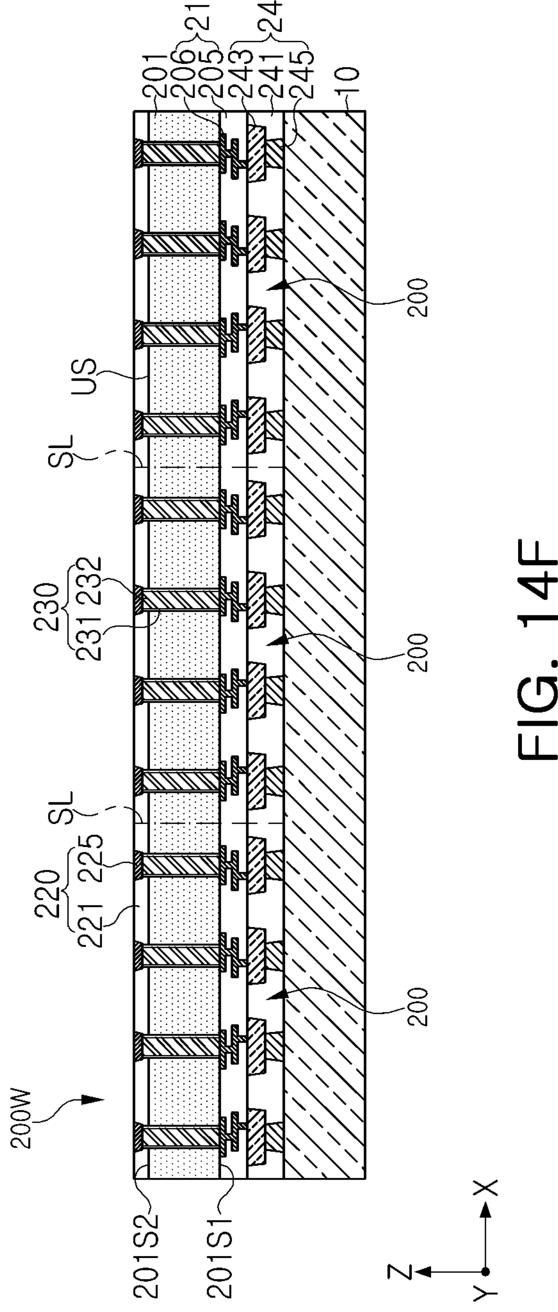

Referring to FIG. 14F, the rear bonding insulating layer 221 and the rear bonding pad 225 may be formed.

The rear bonding insulating layer 221 may be formed to cover portions of the upper and side surfaces of the second through-structure 230 exposed on the second semiconductor chip 200 and to cover the upper surface of the second semiconductor layer 201. According to embodiments, in this process, an upper region of the rear bonding insulating layer 221 may be deposited with a material different from that of the rest of the region by a separate deposition process.

Next, the rear bonding insulating layer 221 may be patterned to form an opening exposing the second through-structure 230, and a conductive material may be deposited in the opening and a planarization process may be performed thereon to form the rear bonding pad 225. The conductive material may include or may be a metal compound, such as titanium nitride (TiN), tantalum nitride (TaN), or tungsten nitride (WN) and/or a metal material, such as tungsten (W), titanium (Ti), aluminum (Al), or copper (Cu).

Figure 14G:
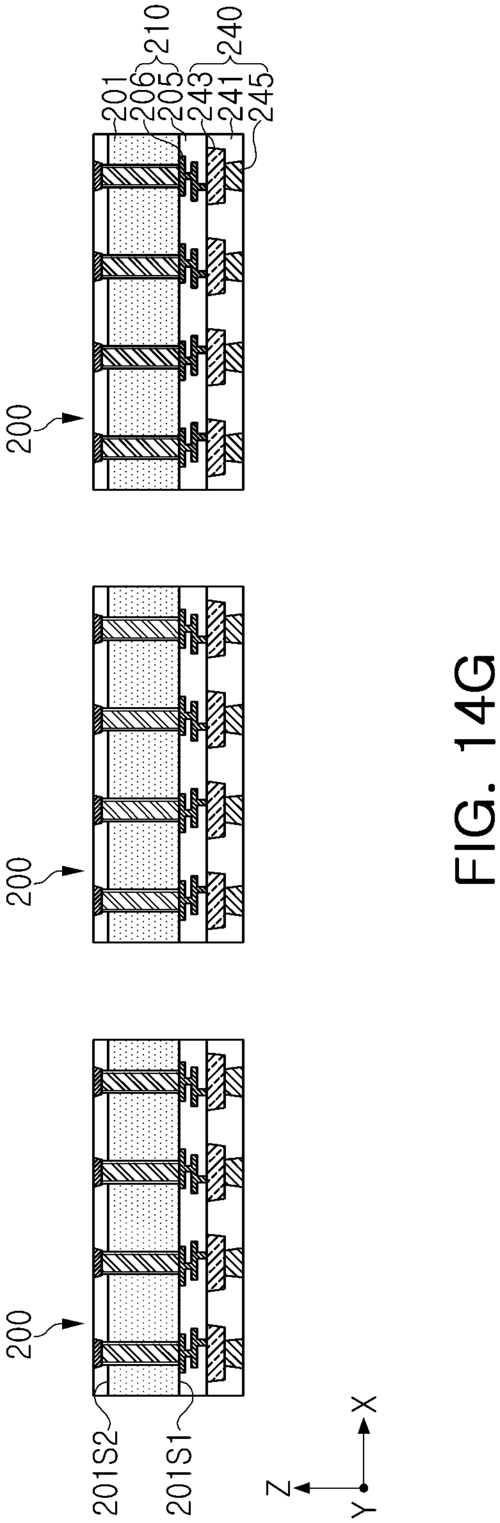

Referring to FIG. 14G, the second semiconductor wafer 200W may be cut along a scribe line SL to separate into a plurality of second semiconductor chips 200. Then, the first carrier 10 may be removed.

Figure 15:
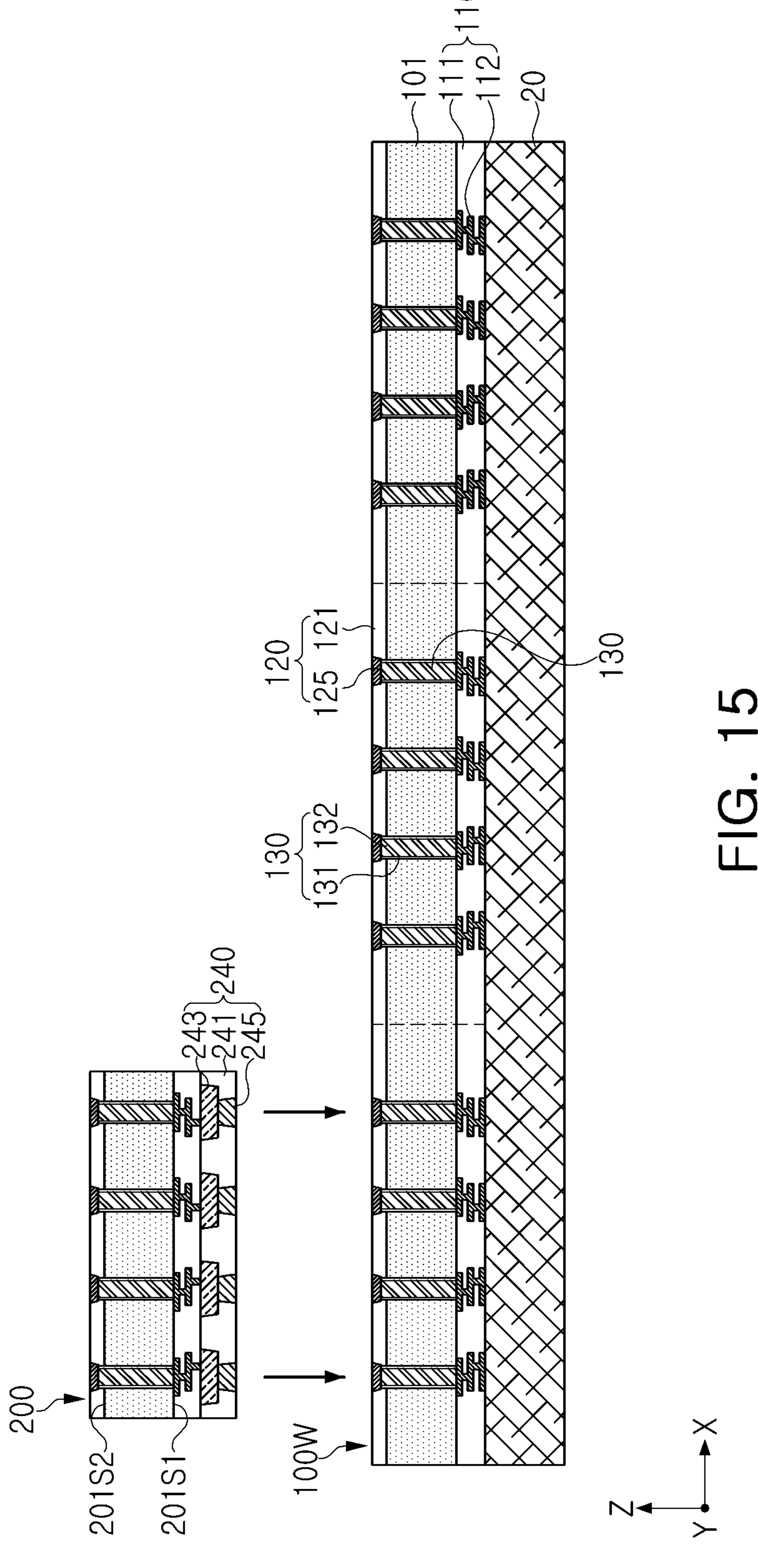
FIGS. 15 to 17 are cross-sectional views illustrating a process of bonding the semiconductor chips manufactured with reference to FIGS. 14A to 14G on a wafer.
Figure 16:
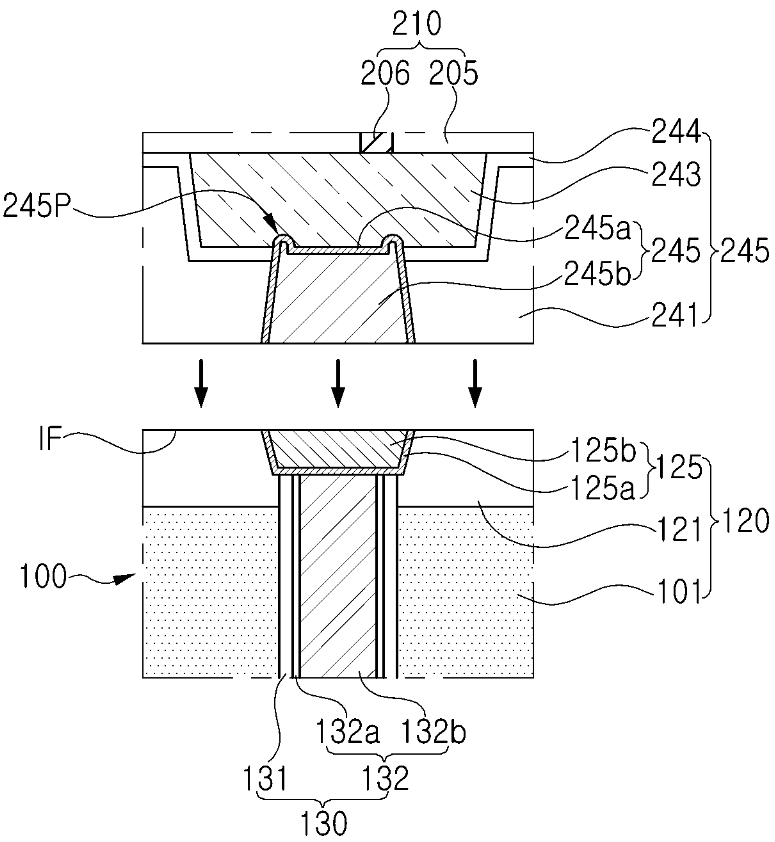
Figure 17:
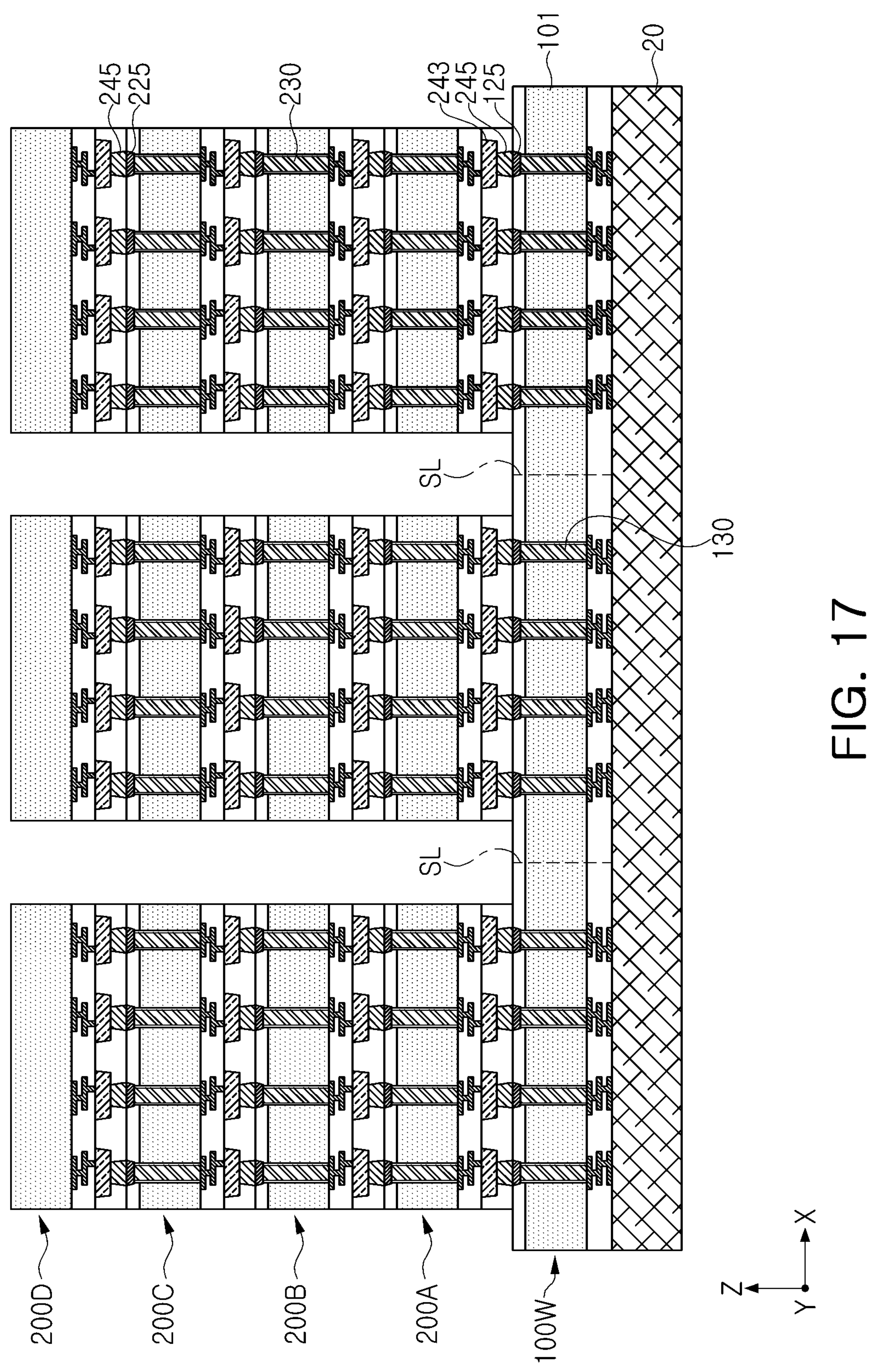

FIGS. 15 to 17 are cross-sectional views illustrating a process of bonding the semiconductor chips manufactured with reference to FIGS. 14A to 14G on a wafer. FIGS. 15 to 17 illustrate a process of bonding the second semiconductor chips manufactured with reference to FIGS. 14A to 14H onto a wafer on which the first semiconductor chip is formed.

Referring to FIG. 15, first, a first semiconductor wafer 100W for the first semiconductor chips 100 having the first through-structure 130 may be attached to a third carrier using an adhesive material layer. The first semiconductor wafer 100W may be in a state in which components for the first semiconductor chips 100 are implemented.

Next, the second semiconductor chip 200 manufactured through the manufacturing process of FIGS. 14A to 14H may be attached on the first semiconductor wafer 100W. The second semiconductor chip 200 may be attached on the first semiconductor wafer 100W such that the second front structure 240 faces the first semiconductor wafer 100W.

Referring to FIG. 16, after the first rear structure 120 of the first semiconductor chip 100 and the second front structure 240 of the second semiconductor chip 200 are bonded to each other, a heat treatment process, such as a thermal compression process, may be performed to achieve direct bonding or hybrid bonding. In the direct bonding, the first bonding pad 125 of the first rear structure 120 and the front bonding pad 245 of the second front structure 240 may come into contact with each other to form copper (Cu)-copper (Cu) bonding, but it is not limited thereto. In addition, the first bonding insulating layer 121 and the front bonding insulating layer 241 may come into contact with each other to be bonded by dielectric-to-dielectric bonding.

Referring to FIG. 17, the second semiconductor chips 200A, 200B, 200C, and 200D may be sequentially stacked. As for the second semiconductor chips 200A, 200B, 200C, and 200D, the other second semiconductor chips 200B, 200C, and 200D may be bonded on a semiconductor chip to stack, for example, on the lowermost second semiconductor chip 200A by direct bonding or hybrid bonding in a manner similar to that described above with reference to FIGS. 15 and 16.

Thereafter, the encapsulant 500 may be formed on the first semiconductor wafer 100W, a polishing process may be performed, and the encapsulant 500 and the first semiconductor wafer 100W may be cut along the scribe line SL to separate into a plurality of semiconductor packages 1000.

In order to describe the bonding process of the first semiconductor chip 100 and the second semiconductor chip 200, die-to-wafer bonding has been described as an example, but according to embodiments, a process of bonding the first semiconductor chip 100 and the second semiconductor chip 200 may be variously changed to die-to-die bonding or wafer-to-wafer bonding.

As the bonding pad for direct bonding between semiconductor chips has protrusions, a contact area between the wiring pad and bonding pad increases, thereby providing a semiconductor package having improved reliability and a manufacturing method thereof.

While example embodiments have been illustrated and described above, it will be apparent to those skilled in the art that modifications and variations could be made without departing from the scope of the present invention as defined by the appended claims.

What is claimed is:

1. A semiconductor package comprising:

a first semiconductor chip including:

a first semiconductor layer, a first through-electrode passing through the first semiconductor layer in a vertical direction, and a first bonding pad connected to the first through-electrode; and a second semiconductor chip including:

a second semiconductor layer, the second semiconductor chip disposed on the first semiconductor chip, a wiring structure between the second semiconductor layer and the first semiconductor chip, a wiring pad connected to the wiring structure below the wiring structure, and a second bonding pad connected to the wiring pad and disposed below the wiring pad, wherein the second bonding pad contacts the first bonding pad and includes a top portion and a protrusion protruding from the top portion into the wiring pad.

2. The semiconductor package of claim 1, wherein the wiring pad includes a metal material different from a material that forms the wiring structure and different from a material that forms the second bonding pad.

3. The semiconductor package of claim 2, wherein the wiring pad includes aluminum (Al), and the second bonding pad includes copper (Cu).

4. The semiconductor package of claim 1, wherein the wiring pad includes a recess portion recessed by the protrusion, and covers the protrusion.

5. The semiconductor package of claim 1, wherein:

the second bonding pad includes a central region and an outer region surrounding the central region, and the protrusion is located in the outer region.

6. The semiconductor package of claim 5, wherein the protrusion has an annular shape or ring shape, integrally extending along the outer region.

7. The semiconductor package of claim 5, wherein the protrusion includes a plurality of projections spaced apart from each other along the outer region.

8. The semiconductor package of claim 1, wherein:

a width of a lower surface of the wiring pad is larger than that of an upper surface of the second bonding pad, and the entire upper surface of the second bonding pad overlaps the lower surface of the wiring pad vertically.

9. The semiconductor package of claim 1, further comprising:

a passivation layer covering side and lower surfaces of the wiring pad, wherein the second bonding pad contacts the wiring pad through the passivation layer.

10. The semiconductor package of claim 9, wherein the protrusion has a portion extending to a space between the passivation layer and the wiring pad.

11. The semiconductor package of claim 1, wherein the second bonding pad has an upper surface including a first surface that is a surface of the protrusion and a second surface extending from the first surface, and the second surface is at a vertical level higher than that of a lower surface of the wiring pad.

12. The semiconductor package of claim 1, wherein the protrusion has a symmetrical shape from a central axis of the second bonding pad in the vertical direction.

13. The semiconductor package of claim 1, wherein the second semiconductor chip further includes a bonding insulating layer disposed on the second semiconductor layer, and wherein the second bonding pad passes at least through the bonding insulating layer and contacts the wiring pad.

14. The semiconductor package of claim 1, wherein the second semiconductor chip includes a second through-electrode passing through the second semiconductor layer and connected to the wiring structure from above the wiring structure.

15. A semiconductor package comprising:

a first semiconductor chip; and a plurality of second semiconductor chips vertically stacked on the first semiconductor chip, wherein each of the plurality of second semiconductor chips includes:

a semiconductor layer having a rear surface and a front surface opposing the rear surface;

a rear bonding pad on the rear surface of the semiconductor layer;

a through-electrode passing through the semiconductor layer and connected to the rear bonding pad;

transistors on the front surface of the semiconductor layer;

a front bonding pad on the front surface of the semiconductor layer;

a wiring structure connecting the through-electrode to the transistors and formed between the front surface and the front bonding pad; and a wiring pad between the wiring structure and the front bonding pad, and wherein the front bonding pad has a top surface and includes a protrusion extending from the top surface into the wiring pad.

16. The semiconductor package of claim 15, wherein the wiring pad includes aluminum (Al) and has a width larger than that of the front bonding pad.

17. The semiconductor package of claim 15, wherein:

each of the plurality of second semiconductor chips further includes:

a rear bonding insulating layer surrounding a side surface of the rear bonding pad; and a front bonding insulating layer surrounding a side surface of the front bonding pad, wherein:

the rear bonding insulating layer and the rear bonding pad form a rear bonding structure;

the front bonding insulating layer and the front bonding pad form a front bonding structure, and the plurality of second semiconductor chips are stacked by directly bonding each rear bonding structure of a lower semiconductor chip to the front bonding structure of an upper semiconductor chip adjacent to the lower semiconductor chip.

18. The semiconductor package of claim 15, wherein:

each rear bonding pad has a first thickness, and each front bonding pad has a second thickness thicker than the first thickness.

19. A semiconductor package comprising:

a first structure; and a second structure on the first structure, wherein the first structure includes:

a first semiconductor layer having a first front surface and a first rear surface opposing each other;

a first device layer on the first front surface of the first semiconductor layer and including a first wiring structure;

a first through-electrode passing through the first semiconductor layer and connected to the first wiring structure of the first device layer; and a first bonding structure including a first bonding pad on the first rear surface of the first semiconductor layer and connected to the first through-electrode and a first bonding insulating layer on a side surface of the first bonding pad, and wherein the second structure includes:

a second semiconductor layer having a second front surface and a second rear surface opposing each other;

a second device layer on the second front surface of the second semiconductor layer and including a second wiring structure; and a second bonding structure including:

a second bonding pad below the second device layer and bonded to contact the first bonding pad, and a second bonding insulating layer bonded to and contacting the first bonding insulating layer, wherein:

the second bonding pad includes a central region and an outer region surrounding the central region, and a height of an upper end of the central region is lower than a height of an upper end of the outer region.

20. The semiconductor package of claim 19, wherein the second bonding pad includes a protrusion protruding toward the second semiconductor layer in the outer region.

* * * * *